United States Patent
Foster et al.

(10) Patent No.: US 6,929,897 B2
(45) Date of Patent: Aug. 16, 2005

(54) PHOTOSENSITIVE BILAYER COMPOSITION

(75) Inventors: Patrick Foster, Franklin, MA (US); Gregory Spaziano, Wakefield, RI (US); Binod B De, Attleboro, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/921,488

(22) Filed: Aug. 19, 2004

(65) Prior Publication Data

US 2005/0042542 A1 Feb. 24, 2005

Related U.S. Application Data

(60) Provisional application No. 60/496,749, filed on Aug. 21, 2003.

(51) Int. Cl.[7] ............................ G03F 7/034; G03F 7/09; G03F 7/20; G03F 7/30; G03F 7/36; G08F 24/00; G08F 30/08
(52) U.S. Cl. ................................ 430/270.1; 430/271.1; 430/325; 430/326; 430/313; 430/905; 430/907; 430/909; 430/910; 430/914; 430/921; 430/925; 526/266; 526/279
(58) Field of Search ................................. 526/266, 279; 430/270.1, 325, 326, 313, 271.1, 905, 907, 909, 910, 914, 921, 925

(56) References Cited

PUBLICATIONS

Chemical Abstract 1989:440010, Kashutina et al ("Synthesis and Properties of Copolymers of Beta–Substituted Oxadisilacyclohexanes with Octamethylcyclotetrasiloxane"), Vysokomolekulyarnye Soedineniya, Seriya A (1989), vol. 31, no. 4. p. 864–9 (Russian).*

* cited by examiner

Primary Examiner—Sin J. Lee
(74) Attorney, Agent, or Firm—Ohlandt, Greeley, Ruggiero & Perle, L.L.P.

(57) ABSTRACT

Polymers and co-polymers having monomeric units formed by the polymerization of monomers of the Structure I Structure I

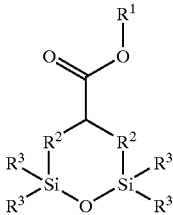

where $R^1$ is a moiety containing an ethylenically unsaturated polymerizable group, $R^2$ is a $C_1$–$C_3$ alkylene group, and $R^3$ is a $C_{1-10}$ linear or cyclic alkyl group, a $C_{6-10}$ aromatic or substituted aromatic group, a $C_{1-8}$ alkoxy methyl, or a $C_{1-8}$ alkoxy ethyl group, are useful as binder resins for photosensitive compositions, and processes for photolithography in the production of semiconductor devices and materials.

64 Claims, No Drawings

PHOTOSENSITIVE BILAYER COMPOSITION

RELATED APPLICATIONS

This application claims priority from U.S. Provisional Patent Application No. 60/496,749 filed Aug. 21, 2003.

FIELD OF THE INVENTION

This invention relates to binder resins for photosensitive compositions, photosensitive compositions derived therefrom, and processes of use of the photosensitive compositions for photolithography in the production of semiconductor devices and materials.

BACKGROUND OF THE INVENTION

The continuing drive for miniaturization of semiconductor devices has caused an increased rigor in the photolithography used to delineate the fine patterns of those devices. The demands for finer resolution have caused the shrinkage of imaging wavelengths from 365 nm (high pressure mercury lamp) to 248 nm (KrF excimer lasers), to 193 nm (ArF excimer lasers) and beyond. As the patterns and wavelengths become finer, the materials properties of the photoresists used for pattern delineation have become more and more demanding. In particular, requirements of sensitivity, transparency, aesthetics of the image produced, and the selectivity of the resists to etch conditions for pattern transfer become more and more strenuous. Because of this, the traditional lithographic materials, such as novolaks, diazonaphthoquinones, etc., are unsuitable platforms for ultra large-scale integration (ULSI) manufacture and beyond.

Advanced photoresists usually employ a technique called chemical amplification in which an acid generated by photolysis catalyzes a solubility switch from alkali insoluble to alkali soluble by removal of an acid sensitive group protecting an alkali-solubilizing moiety. The principle of chemical amplification as a basis for photoresist operation has been known for some years (see U.S. Pat. No. 4,491,628). Most chemically amplified resists have been designed around the use of acid sensitive carboxylic esters or acid sensitive hydroxystyrene derivatives.

The most common type of photoresists are called "single layer" photoresists in which the photoresist has both the function of imaging and plasma etch resistance. Another approach to solving the need for high etch resistance involves the use of multilayer resist systems, typically a bilayer system. In this approach, a thin photoresist imaging layer is deposited over a thicker planarizing layer (undercoat). The photoresist layer is assigned the function of imaging and the undercoat is assigned the function of plasma etch resistance. Bilayer photoresists typically contain silicon and this provides certain advantages in resolution from using thinner imaging films. In many cases the bilayer photoresist/undercoat stack provides better substrate plasma etch resistance than a single layer photoresist. The bilayer system is image-wise exposed and developed to uncover portions of the undercoat. Both layers are exposed to an oxidative etch typically with a gas comprising oxygen. The silicon in the bilayer resist oxidizes to silicon dioxide and protects the underlying undercoat. The uncovered undercoat is oxidized away and thus the image pattern in the resist is transferred into the undercoat. Examples of bilayer photoresists can be found for example in U.S. Pat. No. 6,359,078, U.S. Pat. No. 5,985,524 and U.S. Pat. No. 6,028,154, U.S. Pat. No. 6,146,793, U.S. Pat. No. 6,165,682 each of which is incorporated herein in their entirety.

SUMMARY OF THE INVENTION

One aspect of the invention is a novel silicon-containing polymer useful for single or bilayer photoresist applications which comprises a polymer obtained through polymerization of at least one monomer of Structure I, wherein $R^1$ is a moiety containing an ethylenically unsaturated polymerizable group, each $R^2$ is independently a $C_1$–$C_3$ alkylene group, and each $R^3$ is independently a $C_{1-10}$ linear or cyclic alkyl group, a $C_{6-10}$ aromatic or substituted aromatic group, a $C_{1-8}$ alkoxy methyl, or a $C_{1-8}$ alkoxy ethyl group.

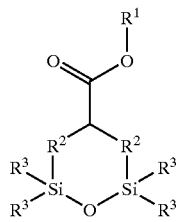

Structure I

Another aspect of the invention described herein is novel photosensitive compositions (photoresists) comprising:

a) at least one polymer comprising a co-polymer obtained through polymerization of at least one monomer of Structure I b) at least one photoacid generator, and c) at least one solvent.

Another aspect of the invention is a bilayer photoresist stack comprising the aforementioned photosensitive composition, an undercoat, and a semiconductor substrate.

Another embodiment of this invention is a process for the lithographic treatment of a substrate by means of a bilayer photoresist process that comprises:

a) providing a substrate, b) coating in a first coating step said substrate with an undercoat solution, c) baking to remove solvent, d) coating in a second coating step a photosensitive composition of this invention over the undercoat to produce a bilayer photoresist stack, e) exposing the bilayer resist stack, f) developing the photosensitive composition portion of the bilayer photoresist stack making a portion of the underlying undercoat visible, g) rinsing the bilayer photoresist stack, and h) etching the visible undercoat in an oxidizing plasma to produce a bilayer relief image.

DETAILED DESCRIPTION OF THE INVENTION

The present invention comprises a polymer obtained through polymerization of at least one monomer of Structure I wherein $R^1$ is a moiety containing an ethylenically unsaturated, polymerizable group, each $R^2$ is independently a $C_1$–$C_3$ alkylene group, and each $R^3$ is independently a $C_{1-10}$ linear or cyclic alkyl group, a $C_{6-10}$ aromatic or substituted aromatic group, a $C_{1-8}$ alkoxy methyl, or a $C_{1-8}$ alkoxy ethyl group.

Structure I

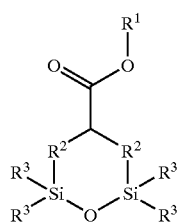

The monomer of Structure I contains two parts, a moiety containing an ethylenically unsaturated, polymerizable group $R^1$ and a cyclic portion that contains silicon, carbon and oxygen. Examples of $R^1$ include, but are not limited to, unsaturated alkenes, vinyl ethers, or acrylate or methacrylate groups. Examples of such polymerizable groups are $C_{1-6}$ linear 1-alkenes, $C_{1-6}$ linear vinyl ethers, and $C_{2-8}$ linear or cyclic alkyl acrylic esters. Examples of preferred polymerizable groups are vinyl, allyl, 1-butenyl, 1-vinyloxyethyl, and 2-ethyl acryloyl, 2-propyl acryloyl or 2-cyclohexyl acryloyl groups.

The cyclic portion of the monomer having Structure I contains silicon, carbon, and oxygen. The size of the ring is from about 5 to about 8 atoms in size. Preferably the ring structure contains 2 silicon atoms and $R^2$ is a methylene, ethylene or propylene group, with a methylene group being more preferred. The two $R^2$ groups may be either two of the same groups described above or two different groups with two methylene groups being preferred. $R^3$ is a $C_{1-10}$ linear or cyclic alkyl group, $C_{6-10}$ aromatic or substituted aromatic, $C_{1-8}$ alkoxy methyl, or $C_{1-8}$ alkoxy ethyl groups. Examples of preferred $R^3$ groups include methyl, ethyl, propyl, or isopropyl, cyclopropyl, cyclopentyl or cyclohexyl, phenyl, 4-methylphenyl, methoxy methyl, ethoxy methyl or methoxy ethyl groups.

Examples of compounds having Structure I include, but are not limited to, the following compounds.

Ia

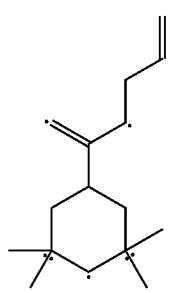

Ib

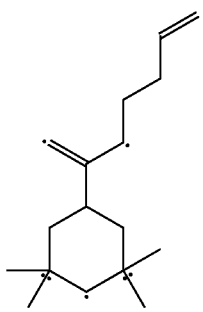

Ic

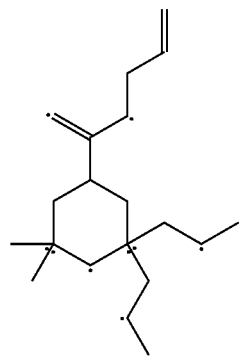

Id

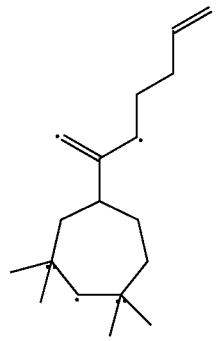

Ie

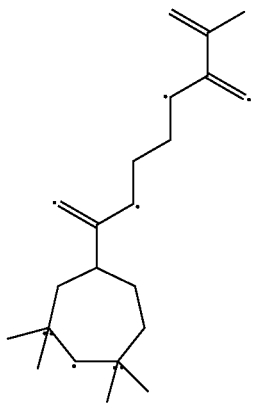

If

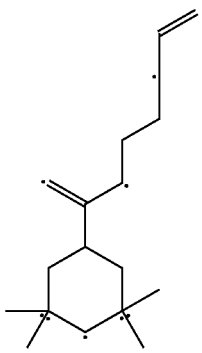

-continued

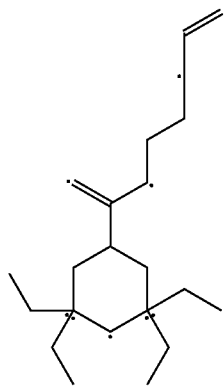

Ig

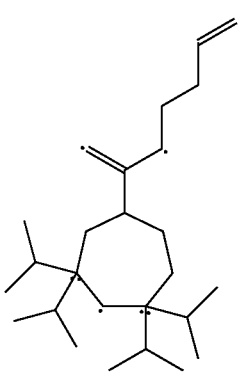

Ih

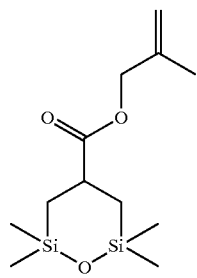

Ii

-continued

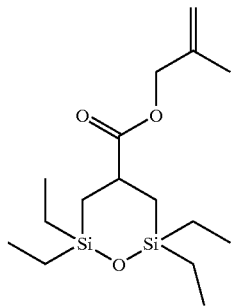

Ij

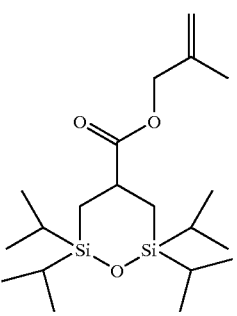

Ik

The cyclic moiety found in Structure I may be synthesized by the reaction of a malonic ester with the anion salt of a dialkyl malonate followed by reaction with a bis(chloroalkyl)disiloxane compound. The cyclic diester obtained can then be hydrolyzed and decarboxylated using standard malonic ester synthesis procedures to obtain the monocarboxylic acid derivative. The monocarboxylic acid derivative can then be esterified using the appropriate $R^1OH$ to give the desired monomer of Structure I using known esterification processes, one of which is illustrated below.

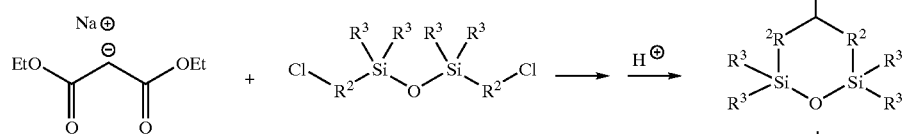

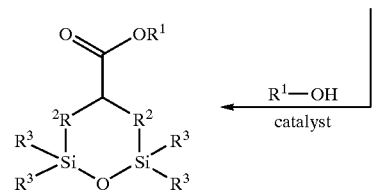

The present invention also includes polymers comprising a co-polymer of at least one monomer of Structure I and at least one acid sensitive ethylenically unsaturated, polymerizable monomer. The monomer contains a masked alkali solubilizing group that upon treatment with acid, unmasks the alkali solubilizing group. Examples of such acid sensitive polymerizable monomers include, but are not limited to, acid labile protected acrylic acid monomers, protected hydroxystyrene monomers, and acid labile protected norbornylene carboxylates

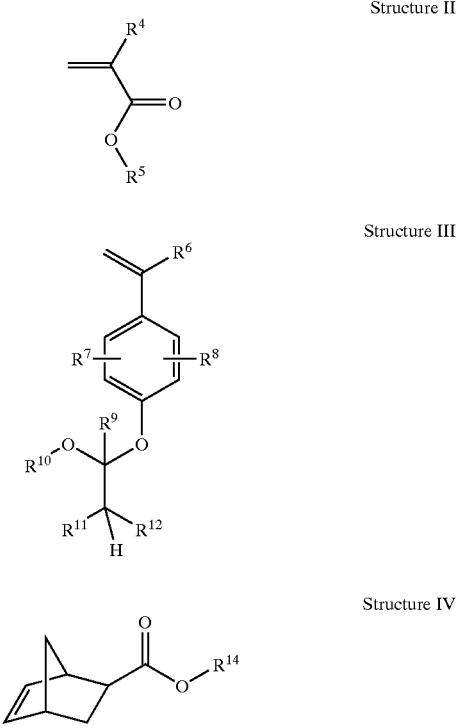

Structure II

Structure III

Structure IV as described in the monomers of Structures II–IV.

In Structure II $R^4$ is a hydrogen, $C_{1-3}$ alkyl group, or a $C_{1-3}$ perfluorinated alkyl group. Examples of preferred $R^4$ groups include hydrogen, methyl or trifluoromethyl group. $R^5$ is an acid cleavable protecting group that generates carboxylic acid when cleaved by acid. $R^5$ may be $C_{4-20}$ branched or cyclic alkyl, $C_{2-8}$ linear or cyclic α-alkoxy alkyl. Those skilled in the art understand that examples of $R^5$ substituents having tertiary carbons or which constitute alpha alkoxy esters have higher acid sensitivities. Examples of preferred $R^5$ include methoxymethyl, ethoxymethyl, tert-butyl, tert-amyl, 1-methylcyclohexyl, 1-methylcyclopentyl, 1-methyl adamantyl, 1-isopropylidene adamantyl, tetrahydrofuranyl, or tetrahydropyranyl. Specific examples of monomers of Structure II include, but are not limited to, t-butyl acrylate, t-butyl methacrylate, 1-methylcyclohexyl methacrylate, tetrahydropyranyl acrylate, t-amyl acrylate, t-amyl methacrylate, 1-methyladamantyl acrylate, 1-methylhydroxyadamantyl methacrylate, t-butyl trifluoromethylacrylate, and 1-methylcyclohexyl trifluoromethylacrylate.

In Structure III $R^6$ is selected from H, $C_1$–$C_4$ lower alkyl, CN, or $CH_2CO_2R^{13}$; $R^7$ and $R^8$ are each independently selected from H, linear or branched $C_1$–$C_4$ alkyl, or halogen; $R^9$ is H, or branched or linear $C_1$–$C_4$ alkyl; $R^{10}$ is selected from substituted or unsubstituted phenyl, a substituted or unsubstituted linear, branched or cyclic $C_1$–$C_{20}$ alkyl, optionally containing an ether or ester group, a substituted or unsubstituted phenylalkylene or a substituted or unsubstituted $C_6$–$C_{20}$ cyclic alkylene; $R^{11}$ and $R^{12}$ are independently selected from H, linear or branched or cyclic $C_1$–$C_{14}$ alkyl, or $C_7$–$C_{14}$ alicyclic; $R^{13}$ is selected from a $C_1$–$C_{14}$ branched linear or cyclic alkyl, substituted or unsubstituted phenyl, or $C_7$–$C_{14}$ alicyclic group. Monomers having Structure III may be prepared by the reaction of a hydroxystyrenic monomer (e.g. hydroxystyrene) with a vinyl ether under acidic conditions or using a alpha halo ether under basic conditions. Specific examples include, but are not limited to 4-(1-ethoxyethoxy)styrene, 4-(1-methoxyethoxy)styrene, 4-(1-t-butoxyethoxy)styrene, 4-(1-cyclohexyloxyethoxy)styrene, 4-(1-cyclohexylethyloxyethoxy)styrene, 4-(1-phenylethyloxyethoxy)styrene, and 4-(1-propoxyethoxy)styrene. Alternatively and more common, the monomer units formed from polymerization of monomers of Structure III may instead be formed after polymerization by reaction of hydroxystyrenic units in the polymer with vinyl ethers or vinyl ether/alcohol mixtures under acidic conditions as described in U.S. Pat. No. 6,380,317 herein incorporated by reference.

In Structure IV $R^{14}$ is an acid cleavable protecting group that generates carboxylic acid when cleaved by acid. $R^{14}$ may be $C_{4-20}$ branched or cyclic alkyl, $C_{2-8}$ linear or cyclic α-alkoxy alkyl. Those skilled in the art understand that examples of $R^{14}$ substituents having tertiary carbons or which constitute alpha alkoxy esters have higher acid sensitivities. Examples of preferred $R^{14}$ include methoxymethyl, ethoxymethyl, tert-butyl, tert-amyl, 1-methylcyclohexyl, 1-methylcyclopentyl, 1-methyl adamantyl, 1-isopropylidene adamantyl, tetrahydrofuranyl, or tetrahydropyranyl. Suitable examples of monomers of Structure IV include, but are not limited to, the methoxymethyl, t-butyl, 1-methyl adamantyl, t-amyl, 1-isopropylideneadamantyl, and 1-methylcyclohexyl esters of 5-norbornene-2-carboxylic acid.

This invention also concerns co-polymers comprising at least one silicon containing monomer of Structure I, at least one acid sensitive ethylenically unsaturated, polymerizable monomer, and at least one other ethylenically unsaturated, polymerizable property enhancing monomer to modify and enhance desirable properties of the copolymer. Suitable modifying monomers include radical polymerizable vinyl monomers such as acrylates, methacrylates, vinyl ethers, vinyl esters, substituted and unsubstituted styrenes and the like. Examples of preferred modifying monomers include, but are not limited to, methyl acrylate, methyl methacrylate, hydroxyethyl acrylate, methyl vinyl ether, ethyl vinyl ether, ethyleneglycol vinyl ether, styrene, t-butyl styrene, and hydroxy styrene.

Additional examples of preferred modifying monomers are unsaturated cyclic anhydrides of Structure V, acrylic esters of Structure VI, or alkenes of Structure VII Structure V

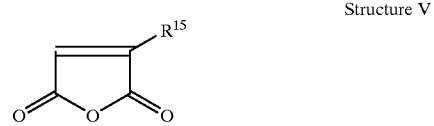

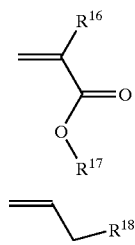

Structure VI

Structure VII

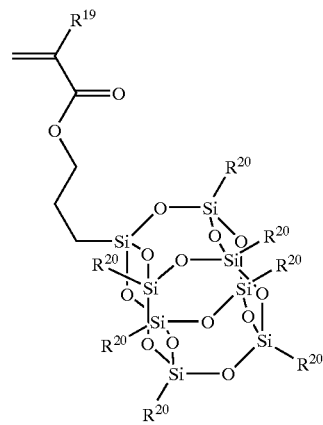

wherein $R^{15}$ is H, a $C_{1-4}$ linear or branched alkyl or a linear or branched $C_{1-4}$ alkoxy group; $R^{16}$ is a hydrogen, a $C_{1-3}$ linear or branched alkyl group, or a linear or branched $C_{1-3}$ perfluorinated alkyl group; $R^{17}$ is a $C_{1-20}$ linear, branched, or cyclic alkyl group, $C_{7-20}$ alicyclic alkyl group, a $C_{1-20}$ linear, branched, or cyclic ether group, or a $C_{1-10}$ aromatic group; and $R^{18}$ is a $C_{1-8}$ alkoxy, or a $C_{1-8}$ alkyl ester, alkyl carboxylate, or hydroxyl group.

Examples of $R^{15}$ include, but are not limited to, methyl, ethyl, propyl, methoxy, ethoxy, and isopropyl. Examples of monomers having Structure V include, but are not limited to, maleic anhydride or citraconic anhydride.

Examples of preferred $R^{16}$ groups include hydrogen, methyl, ethyl, isopropyl, trifluoroethyl or trifluoromethyl groups. Examples of preferred $R^{16}$ groups include hydrogen, methyl or trifluoromethyl group. Examples of suitable $R^{17}$ groups include, but are not limited to, hydrogen, methyl, ethyl, cyclohexyl, cyclopentyl, isobornyl, adamantyl, tetrahydrofuranyl, or decahydronaphthyl, phenyl, or naphthyl groups. Preferred examples of $R^{17}$ are methyl, ethyl, cyclohexyl, adamantyl, tetrahydrofuranyl, or naphthyl groups. Examples of suitable monomers having Structure VI include, but are not limited to, methyl methacrylate, adamantyl methacrylate, cyclohexyl methacrylate, hydroxyethyl methacrylate, phenyl acrylate, methyl trifluoromethylacrylate or naphthyl methacrylate.

Examples of $R^{18}$ groups include, but are not limited to, hydrogen, methyl, ethyl, isopropyl, methoxy, ethoxy, methyl carboxylate, ethyl carboxylate, and acetate. Examples of preferred $R^{18}$ groups are methoxy, ethoxy, methyl carboxylate, ethyl carboxylate, and acetate. Examples of monomers having Structure VIII include, but are not limited to, propylene, butene, allyl alcohol, allyl acetate, vinyl acetic acid, methyl vinyl acetic acid or methyl allyl ether.

Optionally, the copolymers of this invention may contain additional silicon containing monomers. Any suitable silicon containing monomer may be employed as long as it has a polymerizable double bond. Examples of such silicon containing monomers include, but are not limited to, allyltrialkylsilanes, vinyltrialkylsilanes, trialkylsilyl methacrylates or acrylates, cyclic silyl methacrylates or acrylates, and POSS methacrylates or acrylates (see Structure IX). Preferred examples of silicon containing monomers include allytrmiethylsilane, vinyltrimethylsilane, methacryloxy methyltrimethylsilane, methacryloxy propyltris(trimethylsiloxy)silane, or a POSS molecule of Structure IX.

In Structure IX, $R^{19}$ is a hydrogen, a $C_{1-3}$ linear or branched alkyl group, or a linear or branched $C_{1-3}$ perfluorinated alkyl group; each $R^{20}$ is independently a hydrogen, a $C_{1-20}$ linear, branched, or a cyclic alkyl group, a $C_{7-20}$ alicyclic alkyl group, or a $C_{1-10}$ aromatic group. Preferred examples of $R^{20}$ include ethyl, propyl, iso-butyl, cyclopentyl, or phenyl.

The polymer backbones of this invention can be prepared from the corresponding monomers by any suitable conventional polymerization process which reacts an ethylenically unsaturated group. Such processes include, but are not limited to, free radical or controlled radical polymerizations. Such processes typically are run in a solvent or solvent mixture using a catalyst or initiator. Initiators should be chosen based on the temperature to be employed in the polymerization, which in turn may be set by the boiling point of the solvent. The temperature employed may depend on the monomer stability, and the catalytic ability of the catalyst at the operating temperature or by the decomposition half-life of the initiator.

Suitable initiation concentrations are between about 0.001 to about 5.0% moles of initiator to total moles of monomer. The preferred range of initiator concentration is between about 0.01 to about 3.0% moles of initiator to total moles of monomer. The most preferred range of initiator concentration is between about 0.1 to about 2.0% moles of initiator to total moles of monomer.

Examples of suitable free radical initiators include, but are not limited to, benzoyl peroxide, 2,2'-azobisisobutyronitrile, 2,2'-azobis(methylisobutyronitrile), dimethyl 2,2'-azobisisobutyrate and lauroyl peroxide. Optionally, a chain transfer agent (e.g. carbon tetrabromide or 1-dodecanethiol) may be included.

Suitable solvents for polymerization include, but are not limited to, dioxane, tetrahydrofuran, 2-methyltetrahydrofuran, acetonitrile, toluene, ethylacetate, propylene glycol monomethyl ether acetate, tetrahydropyran, methyl ethyl ketone, methyl isobutyl ketone, and diglyme or any combination thereof. Polymers may be isolated by precipitation of the polymerization solution into an appropriate amount of solvent in which the polymer is insoluble. The precipitated polymer may be isolated by filtration and dried using conventional techniques known by someone skilled in the art.

The molecular weight (Mw) of the polymer may range from about 6000 to about 100,000. A preferred molecular weight of the copolymer is from about 7,000 to about 60,000. A most preferred molecular weight of the copolymer is from about 12,000 to about 30,000. The value of Mw can be determined by such standard methods as gel permeation chromatography as described, for example, in Jan Rabek, Experimental Methods in Polymer Chemistry, John Wiley&Sons, New York, 1983. The polydispersity of the polymer may range from 1 to about 6. A preferred polydispersity of the polymer is from about 1 to about 4. A most preferred polydispersity of the polymer is from about 1.5 to about 3.

To function as a polymer for use in a chemically amplified resist, the polymer must contain suitable ratios of monomer units derived from monomers of Structure I, an acid sensitive ethylenically unsaturated, polymerizable monomer such as those monomers having Structure II–IV, and Property Enhancing monomers.

Specifically the polymer must contain a sufficient amount of monomer units derived from the monomer having Structure I (silicon containing monomer) so that the imaging layer can act as a barrier for an $O_2$ based etch, a sufficient amount of an acid sensitive ethylenically unsaturated, polymerizable monomer in order to switch the solubility of the polymer after exposure from insoluble to soluble in aqueous alkali, and a sufficient amount of a property enhancing monomer to impart the desired enhancement to polymer (e.g. hydrophilicity, Tg enhancer). Suitable amounts of any one of the monomer types will be affected by the chemical and physical properties of the other monomer types.

The polymer must contain a sufficient amount of monomer units derived from at least one monomer having Structure I (silicon containing monomer) so that the imaging layer can act as a barrier for an $O_2$ based etch. The % of the monomer required for this function will depend on the silicon content in the monomer. The level of silicon in copolymers is from about 4 to about 18% by weight, preferably from about 6 to about 15% by weight. As the silicon content is increased, the polymer typically becomes more hydrophobic, which may be adjusted for using the Property Enhancing monomer. The silicon content derived from the monomer of Structure I augmented by the inclusion of an additional silicon containing monomer.

The polymer comprises from about 1 to about 50 mole % of the monomer of Structure I. A preferred content of the monomer of Structure 1 in the polymer is from about 10 to about 40 molar %. A more preferred content of the monomer of Structure 1 in the polymer is from about 15 to about 35 molar %. A most preferred content of the monomer of Structure 1 in the polymer is from about 15 to about 30 molar %.

The polymer must contain monomer units derived from a sufficient amount of at least one acid sensitive, ethylenically unsaturated, polymerizable monomer in order to switch the solubility of the polymer after exposure from insoluble to soluble in aqueous alkali. The polymer comprises from about 20 to about 50% mole % of monomer units derived from one or more acid sensitive, ethylenically unsaturated, polymerizable monomers. A preferred polymer composition will comprise from about 25 to about 50 mole % of a monomer derived from at least one acid sensitive, ethylenically unsaturated, polymerizable group. A more preferred polymer composition will comprise from about 30 to about 45 mole % of a monomer derived from at least one acid sensitive, ethylenically unsaturated, polymerizable group. A most preferred polymer composition will comprise from about 35 to about 45 mole % of a monomer derived from at least one acid sensitive, ethylenically unsaturated, polymerizable group, The polymer must contain monomer units derived from a sufficient amount of at least one property enhancing monomer to impart the desired enhancement to the polymer. Examples of polymer properties which may be enhanced include, but are not limited to, hydrophilicity, Tg, adhesion, and plasma etch resistance. The concentration of Property Enhancing monomer in the copolymer may range from about 1 molar % to about 60 mole % of at least one Property Enhancing monomer. A preferred concentration range is from about 10 to about 50 mole %. A more preferred concentration range is from about 20 to about 45 mole %. A most preferred concentration range is from about 25 to about 45 mole %.

A specific example of a preferred copolymer comprises from about 10% to about 50 mole % maleic anhydride, from about 10% to about 40 mole % 1,1,3,3-tetramethyl-1,3-disila-2-oxacyclohexane carboxylic acid allyl ester (ACDS), and from about 25% to about 50 mole % tert-butyl methacrylate (or tert-butyl acrylate). A more preferred example copolymer comprises from about 20% to about 45 mole % maleic anhydride, from about 15% to about 35 mole % 1,1,3,3-tetramethyl-1,3-disila-2-oxacyclohexane carboxylic acid allyl ester, and from about 30% to about 45 mole % tert-butyl methacrylate (or tert-butyl acrylate).

Another specific example of a preferred copolymer comprises from about 10% to about 50 mole % maleic anhydride, from about 10% to about 40 mole % 1,1,3,3-tetramethyl-1,3-disila-2-oxacyclohexane-carboxylic acid β-methallyl ester (MCDS), and from about 25% to about 50 mole % tert-butyl methacrylate (or tert-butyl acrylate). A more preferred example copolymer comprises from about 20% to about 45 mole % maleic anhydride, from about 15% to about 35 mole % 1,1,3,3-tetramethyl-1,3-disila-2-oxacyclohexane-carboxylic acid β-methallyl ester (MCDS), and from about 30% to about 45 mole % tert-butyl methacrylate (or tert-butyl acrylate)

Another specific example of a preferred copolymer comprises from about 10% to about 50 mole % maleic anhydride, from about 10% to about 40 mole % MCDS or ACDS, from about 25% to about 50 mole % tert-butyl methacrylate and from about 2 to about 10 mole % of t-butyl methacrylate-co-3-(3,5,7,9,11,13,15-heptaethylpentacyclo [9.5.1.1$^{3,9}$.1$^{5,15}$.1$^{7,13}$]octa-siloxan-1-yl)propyl methacrylate (methacrylEthyl-POSS). A more preferred example copolymer comprises from about 20% to about 45 mole % maleic anhydride, from about 15% to about 35 mole % MCDS or ACDS, about 30% to about 45 mole % tert-butyl methacrylate and from about 3 to about 7 mole % methacrylEthyl-POSS.

The novel copolymers of this invention can be formulated into a radiation sensitive photoresist composition incorporating any suitable photoacid generator and a suitable spin casting solvent.

Any suitable photoacid generator compound may be used in the photoresist composition. Preferred photoacid generators are those generating sulfonic acids. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. No. 5,558,978 and U.S. Pat. No. 5,468,589, which are incorporated herein by reference. Other suitable photoacid generators are perfluoroalkyl sulfonyl methides and perfluoroalkyl sulfonyl imides as disclosed in U.S. Pat. No. 5,554,664, incorporated herein by reference.

In regard to onium salts, aryl sulfonium and iodonium sulfonates are preferred with triaryl sulfonium and diaryl iodonium sulfonates being more preferred. The aryl groups of the sulfonium or iodonium moieties may be substituted or unsubstituted aryl groups, such as unsubstituted phenyl or naphthyl, or these moieties may be substituted by one or more substituents such as halogen, $C_{1-4}$ alkyl, $C_{1-4}$ alkoxy, —OH and/or nitro substituents. The aryl groups or substituents on each aryl group may be the same or different.

The anion of the photoacid generator may be any suitable organic sulfonic acid anion, such as those derived by deprotonation from acids of aliphatic, cycloaliphatic, carboxylic-aromatic, heterocyclic-aromatic or arylaliphatic sulfonic acids. These anions may be substituted or unsubstituted. Partially fluorinated or perfluorinated sulfonic acid derivatives or sulfonic acid derivatives substituted in neighboring positions to the respective acid group are preferred. Examples of such substituents are halogens, such as chlorine, and particularly fluorine, alkyl, such as methyl, ethyl, n-propyl, or alkoxy, such as methoxy, ethoxy, or n-propoxy or similar substituents.

The anion of the photoacid generator may be monovalent or divalent, with the monovalent anion being preferred. The preferred monovalent anion is derived from a partially fluorinated of perfluorinated sulfonic acid, with fluorinated alkyl sulfonate anions being more preferable.

Examples of suitable onium salts included but are not limited to, triphenyl sulfonium bromide, triphenyl sulfonium chloride, triphenyl sulfonium iodide, triphenyl sulfonium methane sulfonate, triphenyl sulfonium trifluoromethanesulfonate, triphenyl sulfonium hexafluoropropanesulfonate, triphenyl sulfonium nonafluorobutanesulfonate, triphenyl sulfonium perfluorooctanesulfonate, triphenyl sulfonium phenyl sulfonate, triphenyl sulfonium 4-methyl phenyl sulfonate, triphenyl sulfonium 4-methoxyphenyl sulfonate, triphenyl sulfonium 4-chlorophenyl sulfonate, triphenyl sulfonium camphorsulfonate, 4-methylphenyl-diphenyl sulfonium trifluoromethanesulfonate, bis(4-methylphenyl)-phenyl sulfonium trifluoromethanesulfonate, tris-4-methylphenyl sulfonium trifluoromethanesulfonate, 4-tert-butylphenyl-diphenyl sulfonium trifluoromethanesulfonate, 4-methoxyphenyl-diphenyl sulfonium trifluoromethanesulfonate, mesityl-diphenyl sulfonium trifluoromethanesulfonate, 4-chlorophenyl-diphenyl sulfonium trifluoromethanesulfonate, bis(4-chlorophenyl)-phenyl sulfonium trifluoromethanesulfonate, tris(4-chlorophenyl)sulfonium trifluoromethanesulfonate, 4-methylphenyl-diphenyl sulfonium hexafluoropropanesulfonate, bis(4-methylphenyl)-phenyl sulfonium hexafluoropropanesulfonate, tris-4-methylphenyl sulfonium hexafluoropropanesulfonate, 4-tert-butylphenyl-diphenyl sulfonium hexafluoropropane sulfonate, 4-methoxyphenyl-diphenyl sulfonium hexafluoropropane sulfonate, mesityl-diphenyl sulfonium hexafluoropropane sulfonate, 4-chlorophenyl-diphenyl sulfonium hexafluoropropane sulfonate, bis(4-chlorophenyl)-phenyl sulfonium hexafluoropropane sulfonate, tris(4-chrophenyl)sulfonium hexafluoropropane sulfonate, 4-methylphenyl-diphenyl sulfonium perfluorooctanesulfonate, bis(4-methylphenyl)-phenyl sulfonium perfluorooctanesulfonate, tris-4-methylphenyl sulfonium perfluoroocatanesulfonate, 4-tert-butylphenyl-diphenyl sulfonium perfluorooctane sulfonate, 4-methylphenyl-diphenyl sulfonium perfluorooctane sulfonate, mesityl-diphenyl sulfonium perfluorooctane sulfonate, 4-chlorophenyl-diphenyl sulfonium perfluorooctane sulfonate, bis(4-chlorophenyl)-phenyl sulfonium perfluorooctane sulfonate, tris(4-chlrophenyl)sulfonium perfluorooctane sulfonate, diphenyl iodonium hexafluoropropane sulfonate, diphenyl iodonium 4-methylphenyl sulfonate, bis(4-tert-butylphenyl)iodonium trifluoromethane sulfonate, bis(4-tert-butylphenyl)iodonium hexafluoromethane sulfonate, and bis(4-cyclohexylphenyl) iodonium trifluoromethane sulfonate.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. Preferred solvents are propylene glycol monomethyl ether acetate, 2-heptanone, and ethyl lactate.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. In addition, the base can act as a diffusion control agent to prevent the acid from migrating too far and lower resolution. The percentage of base in the composition should be significantly lower than the photoacid generator or otherwise the photosensitivity becomes too low. The preferred range of the base compounds, when present, is about 3% to 50% by weight of the photoacid generator compound. Nitrogenous bases are preferred. Suitable examples of base additives are 2-methylimidazole, tetramethyl ammonium hydroxide, tetrabutylammonium hydroxide, triisopropylamine, 4-dimethylaminopryidine, 4,4'-diaminodiphenyl ether, 2,4,5-triphenylimidazole, and 1,5-diazabicyclo[4.3.0]non-5-ene, and 1,8-diazabicyclo [5.4.0]undec-7-ene.

The photoresist composition may further comprise conventional additives, such as adhesion promoters, dyes, dissolution inhibitors, and surfactants. A person skilled in the art will be able to choose the appropriate desired additive and its concentration.

The silicon-containing polymer will comprise from about 1 to about 20 wt % of the photosensitive composition. The photoacid generator will comprise from about 0.2 to about 3 wt % of the photosensitive composition. The solvent content of the photosensitive composition may range from about 70 wt % to about 98 wt % depending on the thickness desired for the photosensitive coating. The concentration of optional additives may range from about 0.01 to about 10% by weight.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

The photoresist composition is applied uniformly to a suitable substrate by known coating methods. Coating methods include, but are not limited to spray coating, spin coating, offset printing, roller coating, screen printing, extrusion coating, meniscus coating, curtain coating, dip coating, and immersion coating. The substrate may be, for example, semiconductor materials such as a silicon wafer or a ceramic substrate, glass, metal, plastic or other organic film. The coating thickness range generally covers values of about 0.1 micron to more than 10 mm. After the coating operation, the solvent is generally removed by drying. The drying step is typically a heating step called soft bake where the resist and substrate are heated to a temperature of about 50° C. to 150° C. for a few seconds to about 30 minutes; preferably for about 5 seconds to a few minutes, depending on the thickness, the heating element and the end use of the resist. Any suitable baking means may be employed. Examples of suitable baking means include, but are not limited to, a hot plate, an infrared oven, and a convection oven.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, electron beams and x-rays sources. The most preferable radiation sources are KrF excimer lasers and ArF excimer lasers emitting light are 248 nm and 193 nm respectively.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 180 seconds. Any suitable heating means may be employed. The preferred heating means is a hot plate.

After imagewise exposure and any heat treatment of the material, the exposed areas of the photoresist are removed by dissolution in an aqueous base developer to generate a relief structure. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer.

Development can be carried out by means of immersion, spray, puddling, or other similar developing methods known to those skilled in the art at temperatures from about 10° C. to 40° C. for about 30 seconds to about 5 minutes with or without agitation. After development, the relief pattern may be optionally rinsed with a rinse comprising de-ionized water or de-ionized water containing one or more surfactants and dried by spinning, baking on a hot plate, in an oven, or other suitable means.

After the development step, the substrate carrying the resist coating is generally subjected to at least one further treatment step, which changes the substrate in areas not covered by the photoresist coating. Typically, this can be implantation of a dopant, deposition of another material on the substrate or an etching of the substrate. This is usually followed by the removal of the resist coating from the substrate using a suitable stripping method.

Alternatively, the photosensitive composition of this invention may be employed in a multilayer resist process over an undercoat. Another embodiment of this invention is a process for the lithographic treatment of a substrate by means of a bilayer resist process that comprises:

A. providing a substrate,
B. coating in a first coating step said substrate with an undercoat solution,
C. baking to remove solvent,
D. coating in a second coating step a photosensitive composition of this invention over the undercoat to produce a bilayer photoresist stack,
E. exposing the bilayer resist stack,
F. developing the photosensitive composition portion of the bilayer photoresist stack making a portion of the underlying undercoat visible,
G. rinsing the bilayer photoresist stack, and
H. etching the visible undercoat in an oxidizing plasma to produce a bilayer relief image.

Any suitable substrate may be employed. Examples of suitable substrates for use in this invention include, but are not limited to, substrates of silicon, aluminum, copper, chromium, nickel, gold, ferrous metals, aluminum/copper alloys, polymeric resins, silicon dioxide, doped silicon dioxide, silicone resins, silicon nitride, silicon arsenide, gallium arsenide, indium phosphide, indium selenide, indium-tin oxide, tantalum, polysilicon, inorganic glasses, ceramics and alloys, nitrides, or oxides of the metals listed above. Substrates of the type utilized in semiconductor manufacture or manufacture of other electronic components are preferred.

Films of undercoats are typically spun cast from solvents suitable for photoresist applications and optionally baked similarly to a photosensitive coating to remove solvent. Film thickness of the undercoat will vary depending on the exact application but generally range from about 800 Angstroms to about 10,000 angstroms. Thickness of from about 1500 Angstroms to about 5000 Angstroms are preferred.

Any suitable film-forming organic material may be used for the first coating (undercoat layer), such as phenolic resins, particularly novolak resins, polyimide resins, poly (meth)acrylate resins, or styrene-allyl alcohol copolymer resins. Suitable undercoats have several required characteristics. First, there should be no intermixing between the undercoat and resist. Generally this may be achieved by employing a polymer not soluble in the photosensitive composition casting solvent or by casting a film of undercoat and crosslinking it to reduce solubility in the photosensitive composition casting solvent. The crosslinking may be thermally or photochemically induced and may be done during the baking step to remove casting solvent or in a separate step. Examples of photochemical and thermal crosslinking undercoats may be found in U.S. Pat. No. 6,146,793, U.S. Pat. No. 6,054,248, U.S. Pat. No. 6,323,287, and U.S. Pat. No. 6,165,682, U.S. Pat. No. 6,108,808 and those based upon the disclosure in U.S. Patent Application No. 60/552,489, hereby incorporated by reference.

A second characteristic the undercoat layer should have is resistance to the aqueous alkaline developer employed in forming the image in the photosensitive composition. A third characteristic the undercoat layer should have is good plasma etch resistance to a plasma to etch the substrate. In addition, the optical (n,k) parameters of an undercoat should be optimized for the exposure wavelength and photosensitive composition employed so as to minimize reflections.

Coating, exposing, developing and rinsing the photosensitive composition of this invention while on the overcoat is substantially the same as on a substrate as described above. Baking the photoresist film after coating to remove solvent and drying the bilayer stack after rinsing (as described previously) are preferred optional steps option in this process.

After a relief image is formed in the photosensitive composition, the substrate is placed in a plasma-etching environment comprising oxygen. Treatment with the oxygen plasma etch is continued until the undercoat is removed in those places where the top coating has been removed by aqueous development. Conditions such as etch gas composition, time, temperature, and pressure, will depend upon the equipment employed. The silicon in the monomer of Structure I forms silicon dioxide when exposed to an oxygen plasma and this protects the undercoat from being etched so that a bilayer relief structure is formed.

After the oxygen plasma step, the substrate carrying the bilayer relief structure is generally subjected to at least on further treatment step, which changes the substrate in areas not covered by the bilayer coating. Typically this can be implantation of a dopant, deposition of another material on the substrate or etching of the substrate. After this further treatment step, the entire protective coating is removed from the substrate by removal with a suitable stripper or by plasma ashing, after which the entire process is repeated, if needed, to produce further structures onto the substrate.

The present invention is further described in detail by the following examples.

MONOMER SYNTHESIS EXAMPLE 1

Synthesis of 1,1-dicarbethoxy-3,3,5,5-tetramethyl-3,5-disila-4-oxacyclohexane (CDS_E)

Reaction method:

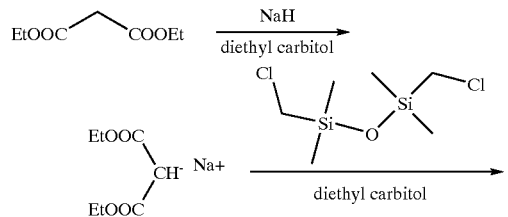

-continued

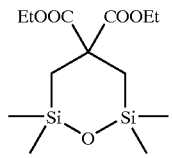

To a dry 1 L 3-neck round bottom flask equipped with a reflex condenser, addition funnel and a $N_2$ gas inlet was added di(ethyleneglycol) diethyl ether (diethyl carbitol) (650 mL, 590.85 g). To the solvent was added sodium hydride (28.80 g, 1.20 mol) under a $N_2$ atmosphere, and the suspension was cooled to ~5° C. in an ice/water bath. To the cooled suspension was added diethyl malonate (192.00 g, 1.20 mol) dropwise through the addition funnel. (CAUTION: A large quantity of $H_2$ gas is evolved.) When the addition of the diethyl malonate was complete, the suspension had turned to a clear solution. The reaction mixture was heated to 50° C. and stirring was continued for 30 minutes at 50° C. To the solution at 50° C. was then added bis(chloromethyl)tetramethyldisiloxane (138.76 g, 0.6 mol) over a 5 minute period through the addition funnel. The reaction mixture was then heated to 112–115° C., and stirring was continued under a $N_2$ atmosphere while the reaction was monitored by GC. After 20 hr, GC showed that a trace amount of bis(chloromethyl)-tetramethyldisiloxane remained (retention time: 11.5 min.). The mixture was cooled to room temperature and the mixture was transferred to a separatory funnel. Water (500 mL) and ethyl acetate were added, and the organic layer was separated. The aqueous layer was extracted with ethyl acetate (400 mL), and the combined organic layers were washed with water (2×500 mL) and saturated aqueous sodium chloride (500 mL). The organic layer was separated, and the ethyl acetate was removed using a rotary evaporator. The remaining solution was vacuum distilled to remove the di(ethyleneglycol) diethyl ether (b.p. 70° C. @ 8 mm Hg). The solution was concentrated to a final weight of 182 g of crude CDS_E. GC of the crude CDS_E solution was obtained (retention time: 15.2 min.). The solution of the crude product was used in the next reaction without further purification.

MONOMER SYNTHESIS EXAMPLE 2

Synthesis of 1-carboxy-3,3,5,5-tetramethyl-3,5-disila-4-oxacyclohexane (CDS)

Reaction method:

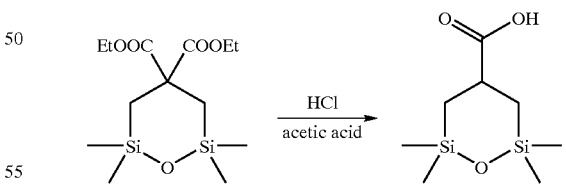

To a 1 L 3-neck, round bottom flask equipped with a reflux condenser, thermocouple, and heating mantle was added the crude solution of CDS_E 182.00 g). To the solution were added acetic acid (500 mL, 524.50 g) and hydrochloric acid (125 mL, 150 g). The mixture was then heated to 116° C., and stirred at 116° C. while the reaction was monitored by GC. After 20 h, GC showed that all of the starting material had been consumed. A distillation head and condenser was attached and 191 g of solvent was removed at atmospheric pressure. The mixture was cooled to room temperature, and further cooling in an ice/water bath while stirring for 30 minutes gave a white suspension. The suspension was filtered and the solid was dried under vacuum at 40° C. for 16 h to give CDS 62.80 g, 48% from the starting bis(chloromethyl)tetramethyldisiloxane) as a white solid. $^1$H NMR (DMSO-d$_6$): δ −0.1−0.2 (12H, m), 0.85−0.9 (2H, d), 0.95−1.0 (2H, d), 2.45(1H, m), 12.05 (1H, br).

MONOMER SYNTHESIS EXAMPLE 3

Synthesis of 1,1,3,3-tetramethyl-1,3-disila-2-oxacyclohexane-carboxylic acid allyl ester (ACDS)

Reaction method:

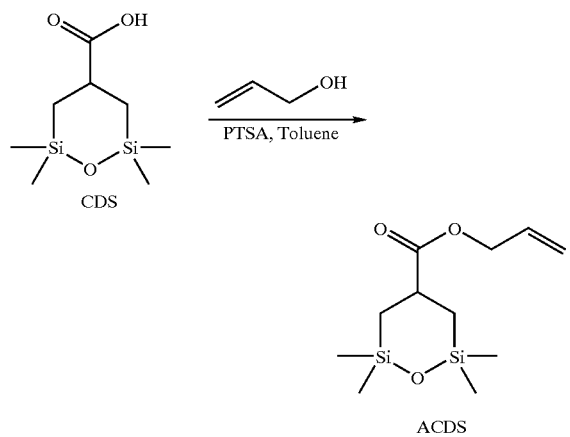

To a 250 mL round bottom flask were added CDS (19.5 g, 89.3 mmol) and toluene (125 mL). To the mixture were added allyl alcohol (15.5 g, 267.9 mmol) and p-toluenesulfonic acid monohydrate (0.2 g, catalytic amount). The flask was fitted with a Dean-Stark trap and a reflux condenser. The solution was then heated to reflux the solvent (~115° C.), and heating was continued until no further water was collected in the Dean-Stark trap (~3 hr). After 3 hr, GC showed that all starting materials were consumed. The mixture was cooled to room temperature, and the mixture was transferred to a 500 mL separatory funnel. The toluene solution was washed with saturated aqueous NaHCO$_3$ (2×125 mL) and saturated aqueous sodium chloride (125 mL). The organic layer was separated and dried over MgSO$_4$. The mixture was filtered and the filtrate was concentrated on a rotary evaporator to remove the toluene. The remaining liquid was vacuum distilled to give two fractions. Fraction one (b.p. 86° C. @ 3 mm Hg) contained the desired product contaminated with a small amount of by-product (1.0 g). The second fraction (b.p. 92° C. @ 3 mm Hg) contained the desired product ACDS (18.8 g, 82% yield) as a colorless liquid. $^1$H NMR (CDCl$_3$): δ 0.0−0.2 (12H, m), 0.9−1.0 (4H, m), 2.65 (1H, m), 4.55−4.65 (2H, d), 5.15−5.20 (2H, dd), 5.9 (1H, m).

MONOMER SYNTHESIS EXAMPLE 4

Synthesis of 1,1,3,3-tetramethyl-1,3-disila-2-oxacyclohexane-carboxylic acid butenyl ester (BCDS)

Reaction method:

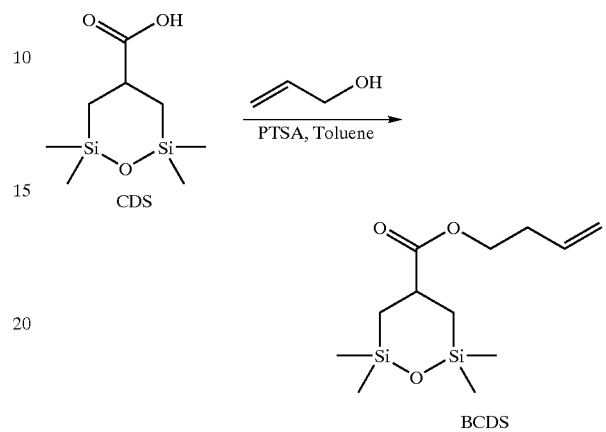

To a 100 mL round bottom flask were added CDS (5.00 g, 22.89 mmol) and toluene (30 mL). To the mixture were added 3-butene-1-ol (4.95 g, 68.7 mmol) and p-toluenesulfonic acid monohydrate (0.2 g, catalytic amount). The flask was fitted with a Dean-Stark trap and a reflux condenser. The solution was then heated to reflux the solvent (~120° C.), and heating was continued until no further water was collected in the Dean-Stark trap (~3 hr). After 3 hr, GC showed that all starting materials were consumed. The mixture was cooled to room temperature, and the mixture was transferred to a 250 mL separatory funnel. The toluene solution was washed with saturated aqueous NaHCO$_3$ (2×30 mL) and saturated aqueous sodium chloride (50 mL). The organic layer was separated and dried over MgSO$_4$. The mixture was filtered and the filtrate was concentrated on a rotary evaporator to remove the toluene. The remaining liquid was vacuum distilled to give two fractions. Fraction one (b.p. 94−95° C. @ 2 mm Hg) contained the desired product contaminated with a small amount of by product (1.0 g). The second fraction (b.p. 95−97° C. @ 2 mm Hg) contained the desired product BCDS (7.4 g, 40% yield) as a colorless liquid. $^1$H NMR (CDCl$_3$): δ 0.0−0.2 (12H, m), 0.9−1.0 (4H, m), 2.5−2.55 (2H, m), 2.65 (1H, m), 4.1−4.15 (2H, t), 5.0−5.1 (2H, m), 5.8 (1H, m).

MONOMER SYNTHESIS EXAMPLE 5

Synthesis of 1,1,3,3-tetramethyl-1,3-disila-2-oxacyclohexane-carboxylic acid vinyloxyethyl ester (CDSVE)

Reaction method:

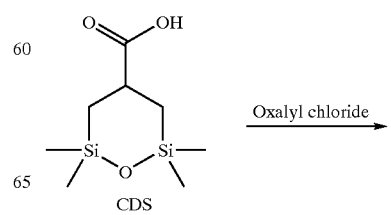

-continued

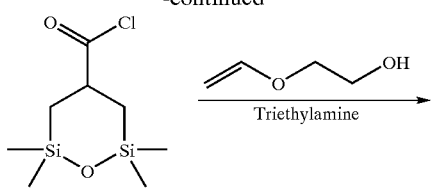

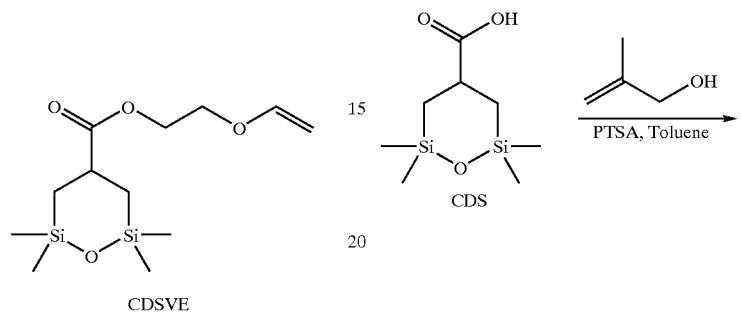

CDSVE

To a 500 mL round bottom flask were added CDS (16.00 g, 73.2 mmol) and tetrahydrofuran (160 mL). The mixture was cooled to 0° C. under $N_2$ and 6 drops of dimethyl formamide was added to it. To the mixture was then added 23.25 g, 183.1 mmol of oxalyl chloride through an addition funnel. When all of the oxalyl chloride was added, the mixture was warmed to room temperature. Then the mixture was stirred at room temperature for additional 1 hr under $N_2$. GC analysis showed that all starting material was consumed, and then the mixture was concentrated under vacuum using a rotary evaporator. 150 ml of THF was added and the mixture was cooled to 0° C. under $N_2$. To the cooled mixture was then added 22.45 g of triethylamine (219.1 mmol) through an addition funnel over 15 mins. 9.68 g of ethyleneglycol vinyl ether was then slowly added through the addition funnel. After the ethyleneglycol vinyl ether addition was completed, the mixture was stirred at 0° C. for 5 mins. The mixture was warmed to room temperature under $N_2$ and the stirring was continued for 18 hr. To the suspension were added 150 mL of water and 150 mL of ethyl acetate. The mixture was then transferred to a 500 mL separatory funnel. The organic layer was washed with saturated aqueous $NaHCO_3$ (2×75 mL) and saturated aqueous sodium chloride (75 mL). The organic layer was separated and dried over $MgSO_4$. The mixture was filtered and the filtrate was concentrated on a rotary evaporator to remove the toluene. The remaining liquid was vacuum distilled to give two fractions. Fraction one (b.p. 93–96° C. @ 2 mm Hg) contained the desired product contaminated with a small amount of by-product (3.18 g). The second fraction (b.p. 97–105° C. @ 2 mm Hg) contained the desired product CDSVE (7.0 g, 50% yield) as a colorless liquid. $^1$H NMR ($CDCl_3$): δ 0.0–0.2 (12H, m), 0.9–1.0 (4H, m), 2.60–2.65 (1H, m), 3.60–3.65 (2H, t), 3.9 (1H, d), 4.3–4.4 (2H, t), 6.5 (1H, m)

MONOMER SYNTHESIS EXAMPLE 6

Synthesis of 1,1,3,3-tetramethyl-1,3-disila-2-oxacyclohexane-carboxylic acid β-methallyl ester (MCDS)

Reaction method:

To a 250 mL round bottom flask were added CDS (14.00 g, 64.10 mmol) and toluene (64.88 g, 75 mL). To the mixture was added β-methallyl alcohol (13.87 g, 192.3 mmol) and p-toluenesulfonic acid monohydrate (0.2 g, catalytic amount). The flask was fitted with a Dean-Stark trap and a reflux condenser. The solution was then heated to reflux the solvent (~112° C.), and heating was continued until no further water was collected in the Dean-Stark trap (~1 hr). After 1 hr, GC showed that ~10% CDS starting material (retention time: 13.7 min.) had remained. To the mixture was then added an additional amount of β-methallyl alcohol (4.62 g, 64.10 mmol), and the esterification was continued for an additional 1 hr. After 2 hr total reaction time, GC showed that ~2% CDS starting material remained. The mixture was cooled to room temperature, and the mixture was transferred to a 500 mL separatory funnel. The toluene solution was washed with saturated aqueous $NaHCO_3$ (2×75 mL) and saturated aqueous sodium chloride (75 mL). The organic layer was separated and dried over $MgSO_4$. The mixture was filtered and the filtrate was concentrated on a rotary evaporator to remove the toluene. The remaining liquid was vacuum distilled to give two fractions. Fraction one (b.p. 96–100° C. @ 3 mm Hg) contained the desired product contaminated with a small amount of by-product (1.17 g). The second fraction (b.p. 100–102° C. @ 3 mm Hg) contained the desired product MCDS (10.40 g, 60% yield) as a colorless liquid. $^1$H NMR ($CDCl_3$): δ 0.0–0.2 (12H, m), 0.9–1.0 (4H, m), 2.1 (3H, s), 2.75–2.80 (1H, m), 4.5 (2H, s), 5.0–5.05(2H, d).

General Synthetic Procedure for Polymerization

The mixture of monomers was dissolved in a suitable solvent under $N_2$ in a round bottom flask equipped with a reflux condenser, a temperature probe and a gas inlet. The mixture was heated to 55° C. while stirring. The mixture was stirred under a $N_2$ atmosphere until all the maleic anhydride was dissolved. The solution was degassed by bubbling $N_2$ into the solution through a syringe needle for 15 minutes. A solution of initiator 2,2'azobis(2-methylbutyronitrile) (Vazo® 67) or dimethyl-2,2'-azobis(2-methylpropionate (V 601) in the same solvent was added dropwise by syringe or as a solid was added and the solution was heated to 65° C. under a $N_2$ atmosphere. The reaction mixture was stirred for 16–20 hours and was monitored by GC until all maleic anhydride monomer was consumed. The reaction mixture was then cooled to room temperature and added dropwise to hexanes or heptanes. The solid polymer was isolated by filtration and washed with hexanes or heptanes. After filtration, the solid was dried at 60° C. for 24 hr under vacuum. Variations of the procedure are noted in the individual examples.

Molecular weights and molecular weight distributions were measured using a Waters Corp. liquid chromatograph (refractive index detection, Millennium (GPC V software), equipped with the following Phenogel-10, 7.8×250 mm columns: 10–4?, 500? & 50? (from Phenomena) and THF eluent. Thermal decomposition measurements (TGA) were performed using a Perkin-Elmer thermal gravimetric analyzer. The glass transition temperature (Tg) of the polymer was measured using a Perkin-Elmer Pyris 1 Differential Scanning Calorimeter at a heating rate of 20° C./minute. The structure and composition of polymer were analyzed with a $^1H$ NMR using a Bruker 400 MHz NMR-spectrometer ($CDCl_3$, Benzoic acid as internal standard).

POLYMER EXAMPLE P-1

Synthesis of Poly(1,1,3,3-tetramethyl-1,3-disila-2-oxacyclohexane carboxylic acid allyl ester-co-maleic anhydride-co-t-butyl acrylate In a 100 mL three neck, round bottom flask equipped with a thermocouple, condenser and a gas inlet were combined maleic anhydride (MA) (1.20 g, 12.2 mmol), 1,1,3,3-tetramethyl-1,3-disila-2-oxacyclohexane carboxylic acid allyl ester (ACDS) (3.17 g, 12.3 mmol), t-butyl acrylate (TBA) (1.62 g, 12.6 mmol) and toluene (9.00 g). To the mixture was added Vazo® 67 (0.22 g, 1.1 mmol) in 0.5 g of toluene and the mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 1.

TABLE 1

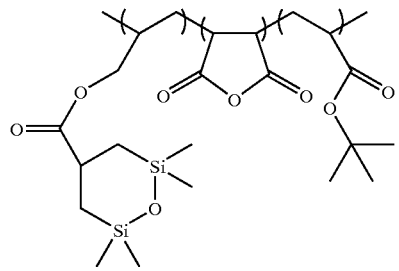

| Polymer Synthesis # | Composition (mol %) | | | GPC | | Yield (%) | Tg (° C.) |
|---|---|---|---|---|---|---|---|
| | ACDS | MA | TBA | Mw | PD | | |
| P-1 | 23 | 36 | 41 | 12900 | 2.54 | 50 | 95 |

POLYMER EXAMPLE P-2

Synthesis of Poly(1,1,3,3-tetramethyl-1,3-disila-2-oxacyclohexane carboxylic acid 1-butenyl ester-co-maleic anhydride-co-t-butyl acrylate In a 100 mL three neck, round bottom flask equipped with a thermocouple, condenser and a gas inlet was combined maleic anhydride (1.17 g, 11.9 mmol), 1,1,3,3-tetramethyl-1,3-disila-2-oxacyclohexane carboxylic acid 1-butenyl ester (BCDS; 3.25 g, 11.9 mmol), t-butyl acrylate (1.58 g, 12.3 mmol) and toluene (9.00 g). To the mixture was added 2,2'-azobis(2-methylbutyronitrile) (0.21 g, 1.1 mmol) and the mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 2.

TABLE 2

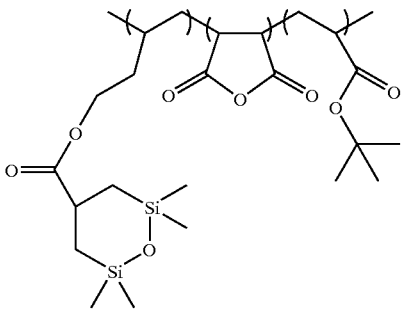

| Polymer Synthesis # | Composition (mol %) | | | GPC | | Yield (%) |
|---|---|---|---|---|---|---|
| | BCDS | MA | TBA | Mw | PD | |
| P-2 | 22 | 36 | 42 | 9700 | 2.29 | 53 |

POLYMER EXAMPLE P-3

Synthesis of Poly(1,1,3,3-tetramethyl-1,3-disila-2-oxacyclohexane carboxylic acid vinyloxyethyl ester-co-maleic anhydride-co-t-butyl methacrylate In a 100 mL three neck, round bottom flask equipped with a thermocouple, condenser and a gas inlet were combined maleic anhydride (1.10 g, 11.2 mmol), 1,1,3,3-tetramethyl-1,3-disila-2-oxacyclohexane carboxylic acid vinyloxyethyl ester (CDSVE) (3.25 g, 11.3 mmol), t-butyl methacrylate (1.65 g, 11.6 mmol) and tetrahydrofuran (9.00 g). To the mixture was added Vazo® 67 (0.13 g, 0.7 mmol) and the mixture was polymerized and isolated according to the General Polymerization Procedure. The resulting polymer solution was precipitated in hexanes (175 mL). The suspension was filtered using a Buchner funnel and washed with hexanes (2×50 mL). Analytical and other data can be found in Table 3.

TABLE 3

| Polymer Synthesis | Composition (mol %) | | | GPC | | Yield (%) | Tg (° C.) |
|---|---|---|---|---|---|---|---|
| | CDSVE | MA | TBMA | Mw | PD | | |
| P-3 | 25 | 38 | 37 | 22500 | 2.97 | 41 | 98 |

POLYMER EXAMPLE P-4

Synthesis of Poly(1,1,3,3-tetramethyl-1,3-disila-2-oxacyclohexane carboxylic acid vinyloxyethyl ester-co-maleic anhydride-co-t-butyl methacrylate-co-methyl methacrylate In a 100 mL three neck, round bottom flask equipped with a thermocouple, condenser and a gas inlet were combined maleic anhydride (1.13 g, 11.5 mmol), 1,1,3,3-tetramethyl-1,3-disila-2-oxacyclohexane carboxylic acid vinyloxyethyl ester (CDSVE; 3.32 g, 11.5 mmol), t-butyl methacrylate (1.24 g, 8.7 mmol), methyl methacrylate (0.31 g, 3.1 mmol) and tetrahydrofuran (9.00 g). To the mixture was added 2,2'-azobis(2-methylbutyronitrile) (0.14 g, 0.7 mmol) and the mixture was polymerized and isolated according to the General Polymerization Procedure. The resulting polymer solution was precipitated in hexanes (150 mL). The suspension was filtered using a Buchner funnel and washed with hexanes (2×50 mL. Analytical and other data can be found in Table 4.

TABLE 4

| Polymer Synthesis | Composition (mol %) | | | | GPC | | Yield (%) |
|---|---|---|---|---|---|---|---|
| | CDSVE | MA | TBMA | MMA | Mw | PD | |
| P-4 | 25 | 35 | 29 | 11 | 22900 | 2.59 | 67 |

POLYMER EXAMPLE P-5

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (3.09 g, 31.5 mmol), 1,1,3,3-tetramethyl-1,3-disila-2-oxacyclohexane carboxylic acid allyl ester (ACDS; 9.09 g, 35.2 mmol), t-butyl methacrylate (2.82 g, 19.8 mmol) and toluene (15.00 g). To the mixture was added 2,2'-azobis(2-methylbutyronitrile) (0.32 g, 1.7 mmol) and the mixture was polymerized and isolated according to the General Polymerization Procedure. The resulting polymer solution was precipitated in hexanes (300 mL). The suspension was filtered using a Buchner funnel and washed with hexanes (2×50 mL). Analytical and other data can be found in Table 5.

POLYMER EXAMPLE P-6

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (1.17 g, 11.93 mmol), 1,1,3,3-tetramethyl-1,3-disila-2-oxacyclohexane carboxylic acid allyl ester (ACDS; 3.08 g, 11.91 mmol), t-butyl methacrylate(TBMA) (1.75 g, 12.30 mmol) and THF (6.0 g). To the mixture was added Vazo® 67 (35 mg, 0.18 mmol) in 0.5 g of THF and the mixture was polymerized and isolated according to the General Polymerization Procedure. After 14 hr, the resulting polymer solution was cooled to room temperature and then precipitated in hexanes (100 mL). The suspension was filtered using a Buchner funnel and washed with hexanes (2×25 mL). Analytical and other data can be found in Table 5.

POLYMER EXAMPLE P-7

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet was combined maleic anhydride (0.94 g, 9.58 mmol), 1,1,3,3-tetramethyl-1,3-disila-2-oxacyclohexane carboxylic acid allyl ester (ACDS; 2.49 g, 9.58 mmol), t-butyl methacrylate (1.07 g, 7.52 mmol) and toluene (5.0 g). To the mixture was added Vazo® 67 (100 mg, 0.54 mmol) in 0.5 g of toluene and the mixture was polymerized and isolated according to the General Polymerization Procedure. After 14 hr, the resulting polymer solution was cooled to room temperature and then precipitated in hexanes (100 mL). The suspension was filtered using a Buchner funnel and washed with hexanes (2×25 mL). Analytical and other data can be found in Table 5.

POLYMER EXAMPLE P-8

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (3.09 g, 31.51 mmol), 1,1,3,3-tetramethyl-1,3-disila-2-oxacyclohexane carboxylic acid allyl ester (ACDS; 9.09 g, 35.17 mmol), t-butyl methacrylate (2.82 g, 19.83 mmol) and toluene (14.5 g). To the mixture was added Vazo® 67 (320 mg, 1.66 mmol) in 0.5 g of toluene and the mixture was polymerized and isolated according to the General Polymerization Procedure. After 14 hr, the resulting polymer solution was cooled to room temperature then precipitated in hexanes (200 mL). The suspension was filtered using a Buchner funnel and washed with hexanes (2×50 mL). Analytical and other data can be found in Table 5.

POLYMER EXAMPLE P-9

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (2.72 g, 27.73 mmol), 1,1,3,3-tetramethyl-1,3-disila-2-oxacyclohexane carboxylic acid allyl ester (ACDS; 9.54 g, 36.9 mmol), t-butyl methacrylate (2.74 g, 19.29 mmol) and toluene (14.5 g). To the mixture was added Vazo® 67 (310 mg, 1.6 mmol) in 0.5 g of toluene and the mixture was polymerized and isolated according to the General Polymerization Procedure. After 14 hr, the resulting polymer solution was cooled to room temperature then precipitated in hexanes (200 mL). The suspension was filtered using a Buchner funnel and washed with hexanes (2×50 mL). Analytical and other data can be found in Table 5.

POLYMER EXAMPLE P-10

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (2.40 g, 24.48 mmol), 1,1,3,3-tetramethyl-1,3-disila-2-oxacyclohexane carboxylic acid allyl ester (ACDS; 9.93 g, 38.42 mmol), t-butyl methacrylate (2.67 g, 18.77 mmol) and toluene (14.5 g). To the mixture was added Vazo® 67 (320 mg, 1.66 mmol) in 0.5 g of toluene the mixture was polymerized and isolated according to the General Polymerization Procedure. After 14 hr, the resulting polymer solution was cooled to room temperature and then precipitated in hexanes (200 mL). The suspension was filtered using a Buchner funnel and washed with hexanes (2×50 mL). Analytical and other data can be found in Table 5.

POLYMER EXAMPLE P-11

Synthesis of Poly(1,1,3,3-tetramethyl-1,3-disila-2-oxacyclohexane carboxylic acid allyl ester-co-maleic anhydride-co-t-butyl methacrylate In a 250 mL three neck, round bottom flask equipped with a thermocouple, condenser and a gas inlet were combined maleic anhydride (9.96 g, 101.5 mmol), 1,1,3,3-tetramethyl-1,3-disila-2-oxacyclohexane carboxylic acid allyl ester (ACDS; 34.98 g, 135.3 mmol), t-butyl methacrylate (10.06 g, 70.7 mmol) and toluene (55.0 g). To the mixture was added Vazo® 67 (1.77 g, 9.2 mmol) in 0.5 g of toluene and 0.27 g of 1-dodecanethiol and the mixture was polymerized and isolated according to the General Polymerization Procedure. The resulting polymer solution was precipitated in hexanes (500 mL). Analytical and other data can be found in Table 5.

POLYMER EXAMPLE P-12

Synthesis of Poly(1,1,3,3-tetramethyl-1,3-disila-2-oxacyclohexane carboxylic acid allyl ester-co-maleic anhydride-co-t-butyl methacrylate In a 250 mL three neck, round bottom flask equipped with a thermocouple, condenser and a gas inlet were combined maleic anhydride (9.96 g, 101.5 mmol), 1,1,3,3-tetramethyl-1,3-disila-2-oxacyclohexane carboxylic acid allyl ester (ACDS; 34.98 g, 135.3 mmol), t-butyl methacrylate (10.06 g, 70.7 mmol) and toluene (55.0 g). To the mixture was added Vazo® 67 (1.77 g, 9.2 mmol) in 0.5 g of toluene and 0.53 g of 1-dodecanethiol. The mixture was polymerized and isolated according to the General Polymerization Procedure. The resulting polymer solution was precipitated in hexanes (500 mL). Analytical and other data can be found in Table 5.

POLYMER EXAMPLE P-13

Synthesis of Poly(1,1,3,3-tetramethyl-1,3-disila-2-oxacyclohexane carboxylic acid allyl ester-co-maleic anhydride-co-t-butyl methacrylate In a 100 mL three neck, round bottom flask equipped with a thermocouple, condenser and a gas inlet were combined maleic anhydride (3.62 g, 36.92 mmol), 1,1,3,3-tetramethyl-1,3-disila-2-oxacyclohexane carboxylic acid allyl ester (ACDS; 12.72 g, 49.2 mmol), t-butyl methacrylate (3.66 g, 25.73 mmol) and toluene (19.5 g). To the mixture was added Vazo® 67 (0.65 g, 3.38 mmol) and 1-dodecanethiol (0.20 g) in 0.5 g of toluene. The mixture was polymerized and isolated according to the General Polymerization Procedure. After 14 hr, the resulting polymer solution was cooled to room temperature and then precipitated in hexanes (200 mL). The suspension was filtered using a Buchner funnel and washed with hexanes (2×50 mL). Analytical and other data can be found in Table 5.

TABLE 5

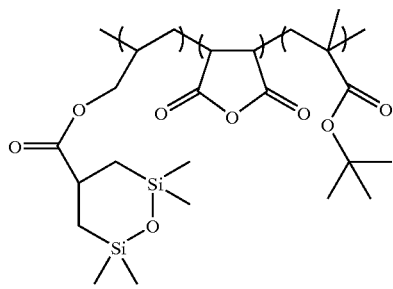

| Polymer Synthesis # | Composition (mol %) | | | GPC | | Yield (%) | Tg (° C.) |
|---|---|---|---|---|---|---|---|
| | ACDS | MA | TBMA | Mw | PD | | |
| P-5 | 26 | 41 | 33 | 20400 | 3.05 | 65 | |
| P-6 | 14 | 57 | 30 | 20400 | 4.67 | 51 | 115 |
| P-7 | 18 | 39 | 44 | 25000 | 4.1 | 45 | |
| P-8 | 26 | 41 | 33 | 20800 | 3.22 | | 106 |
| P-9 | 26 | 41 | 33 | 20400 | 3.05 | | 107 |
| P-10 | 26 | 37 | 37 | 19700 | 3.02 | | 103 |
| P-11 | 24 | 40 | 36 | 14600 | 2.53 | 62 | 104 |
| P-12 | 24 | 40 | 36 | 11200 | 2.18 | 60 | 103 |
| P-13 | 25 | 37 | 38 | 10736 | 2.12 | 50 | 103 |

POLYMER EXAMPLE P-14

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (3.54 g, 36.1 mmol), 1,1,3,3-tetramethyl-1,3-disila-2-oxacyclohexane carboxylic acid allyl ester (ACDS; 9.86 g, 38.15 mmol), t-butyl methacrylate (3.52 g, 24.75 mmol), 3-(3,5,7,9,11,13,15-heptaethylpentacyclo [$9.5.1.1^{3,9}.1^{5,15}.1^{7,13}$]octa-siloxan-1-yl)propyl methacrylate (methacryl Ethyl-POSS) (T8MA) (3.08 g, 4.11 mmol) and toluene (20.0 g). To the mixture was added Vazo® 67 (0.59 g, 2.92 mmol) and 0.18 g of 1-dodecanethiol. The mixture was polymerized and isolated according to the General Polymerization Procedure. The resulting polymer solution was precipitated in hexanes (200 mL). The suspension was filtered using a Buchner funnel and washed with hexanes (2×50 mL). Analytical and other data can be found in Table 6.

POLYMER EXAMPLE P-15

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (3.36 g, 34.26 mmol), 1,1,3,3-tetramethyl-1,3-disila-2-oxacyclohexane carboxylic acid allyl ester (ACDS; 8.88 g, 34.26 mmol), t-butyl methacrylate (3.34 g, 23.48 mmol), methacrylEthyl-POSS (4.40 g, 5.89 mmol) and toluene (20.0 g). To the mixture was added Vazo® 67 (0.56 g, 3.04 mmol) and 0.17 g of 1-dodecanethiol. The mixture was polymerized and isolated according to the General Polymerization Procedure. The resulting polymer solution was precipitated in hexanes (200 mL). The suspension was filtered using a Buchner funnel and washed with hexanes (2×50 mL). Analytical and other data can be found in Table 6.

POLYMER EXAMPLE P-16

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (3.34 g, 34.06 mmol), 1,1,3,3-tetramethyl-1,3-disila-2-oxacyclohexane carboxylic acid allyl ester (ACDS; 9.86 g, 38.15 mmol), t-butyl methacrylate (3.52 g, 24.75 mmol), methacrylEthyl-POSS (3.08 g, 4.12 mmol) and toluene (20.0 g). To the mixture was added Vazo® 67 (0.59 g, 3.07 mmol) and 0.18 g of 1-dodecanethiol. The mixture was polymerized and isolated according to the General Polymerization Procedure. The resulting polymer solution was precipitated in hexanes (200 mL). The suspension was filtered using a Buchner funnel and washed with hexanes (2×50 mL). Analytical and other data can be found in Table 6.

POLYMER EXAMPLE P-17

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (2.68 g, 27.33 mmol), 1,1,3,3-tetramethyl-1,3-disila-2-oxacyclohexane carboxylic acid allyl ester (ACDS; 5.20 g, 20.12 mmol), t-butyl methacrylate (4.12 g, 28.97 mmol), methacrylEthyl-POSS (3.00 g, 4.01 mmol) and toluene (15.0 g). To the mixture was added Vazo® 67 (0.46 g, 2.39 mmol) and 0.14 g of 1-dodecanethiol. The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 6.

POLYMER EXAMPLE P-18

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (2.60 g, 26.5 mmol), 1,1,3,3-tetramethyl-1,3-disila-2-oxacyclohexane carboxylic acid allyl ester (ACDS; 6.05 g, 23.41 mmol), t-butyl methacrylate (3.44 g, 24.20 mmol), methacrylEthyl-POSS (3.44 g, 4.60 mmol) and toluene (15.0 g). To the mixture was added Vazo® 67 (0.45 g, 2.39 mmol) and 0.13 g of 1-dodecanethiol. The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 6.

POLYMER EXAMPLE P-19

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo[$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (2.68 g, 27.32 mmol), 1,1,3,3-tetramethyl-1,3-disila-2-oxacyclohexane carboxylic acid allyl ester (ACDS; 5.20 g, 20.12 mmol), t-butyl methacrylate (4.12 g, 28.97 mmol), methacrylEthyl-POSS (3.0 g, 4.01 mmol) and toluene (15.0 g). The mixture was stirred under a $N_2$ atmosphere until all the maleic anhydride was dissolved. To the mixture was added Vazo® 67 (0.45 g, 2.39 mmol) and 0.13 g of 1-dodecanethiol. The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 6.

POLYMER EXAMPLE P-20

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo[$9.5.1.1^{3,9}.1^{5,15}.1^{7,13}$]octa-siloxan-1-yl)propyl methacrylate In a 100 mL three neck, round bottom flask equipped with a thermocouple, condenser and a gas inlet were combined maleic anhydride (37.42 g, 26.5 mmol), 1,1,3,3-tetramethyl-1,3-disila-2-oxacyclohexane carboxylic acid allyl ester (ACDS; 7.12 g, 27.5 mmol), t-butyl methacrylate (5.09 g, 35.79 mmol), methacrylEthyl-POSS (4.12 g, 5.51 mmol) and toluene (20.0 g). To the mixture was added Vazo® 67 (0.64 g, 3.33 mmol). The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 6.

TABLE 6

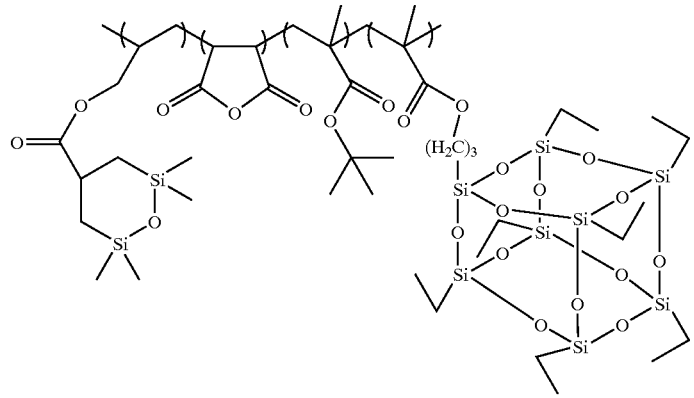

| Polymer Synthesis | Composition (mol %) | | | | GPC | | Yield (%) | Tg (° C.) |
|---|---|---|---|---|---|---|---|---|
| # | ACDS | MA | TBMA | T8MA | Mw | PD | | |
| P-14 | 27 | 31 | 37 | 5 | 16584 | 2.81 | 33 | 95 |
| P-15 | 26 | 34 | 34 | 6 | 19332 | 3.01 | 33 | |
| P-16 | 27 | 34 | 34 | 5 | 16700 | 2.74 | | 96 |
| P-17 | 17 | 47 | 29 | 6 | 18624 | 2.93 | 49 | |
| P-18 | 17 | 31 | 47 | 6 | 23132 | 3.07 | 30 | 104 |
| P-19 | 17 | 30 | 47 | 6 | 18134 | 2.98 | 25 | 100 |
| P-20 | 18 | 36 | 41 | 4 | 9421 | 2.89 | 43 | 74 |

POLYMER EXAMPLE P-21

Synthesis of Poly(1,1,3,3-tetramethyl-1,3-disila-2-oxacyclohexane carboxylic acid methallyl ester-co-maleic anhydride-co-t-butyl methacrylate-co-3-(3,5,7,9,11,13,15-heptaethylpentacyclo [9.5.1.1$^{3,9}$.1$^{5,15}$.1$^{7,13}$]octa-siloxan-1-yl)propyl methacrylate In a 100 mL three neck, round bottom flask equipped with a thermocouple, condenser and a gas inlet were combined maleic anhydride (2.09 g, 21.3 mmol), 1,1,3,3-tetramethyl-1,3-disila-2-oxacyclohexane carboxylic acid methallyl ester (MCDS) (3.64 g, 13.4 mmol), t-butyl methacrylate (2.28 g, 16 mmol), methacrylEthyl-POSS (1.99 g, 2.66 mmol) and THF (15 g). To the mixture was added V 601 (0.061 g, 0.26 mmol). The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 7.

TABLE 7

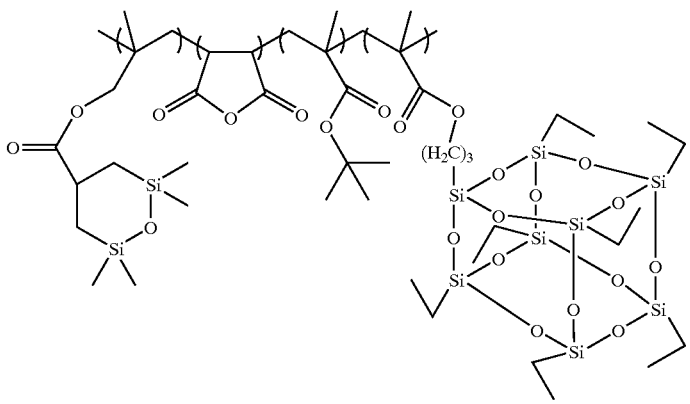

| Polymer Synthesis | Composition (mol %) | | | | GPC | | Yield (%) | Tg (° C.) |
|---|---|---|---|---|---|---|---|---|
| | MCDS | MA | TBMA | T8MA | Mw | PD | | |
| P-21 | 17 | 42 | 37 | 4 | 13400 | 3 | 65 | 108 |

POLYMER EXAMPLE P-22

Synthesis of Poly(1,1,3,3-tetramethyl-1,3-disila-2-oxacyclohexane carboxylic acid methallyl ester-co-maleic anhydride-co-t-butyl methacrylate In a 100 mL three neck, round bottom flask equipped with a thermocouple, condenser and a gas inlet were combined maleic anhydride (1.90 g, 19.37 mmol), 1,1,3,3-tetramethyl-1,3-disila-2-oxacyclohexane carboxylic acid methallyl ester (MCDS; 5.27 g, 19.37 mmol), t-butyl methacrylate (2.83 g, 19.90 mmol) and THF (18.57 g). To the mixture was added V 601 (0.067 g, 0.29 mmol). The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 8.

POLYMER EXAMPLE P-23

Synthesis of Poly(1,1,3,3-tetramethyl-1,3-disila-2-oxacyclohexane carboxylic acid methallyl ester-co-maleic anhydride-co-t-butyl methacrylate In a 100 mL three neck, round bottom flask equipped with a thermocouple, condenser and a gas inlet were combined maleic anhydride (1.99 g, 20.30 mmol), 1,1,3,3-tetramethyl-1,3-disila-2-oxacyclohexane carboxylic acid methallyl ester (MCDS; 5.53 g, 20.30 mmol), t-butyl methacrylate (2.47 g, 17.34 mmol) and THF (18.57 g). To the mixture was added V 601 (0.067 g, 0.29 mmol). The mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 8.

TABLE 8

| Polymer Synthesis | Composition (mol %) | | | GPC | | Yield (%) | Tg (° C.) |
|---|---|---|---|---|---|---|---|
| | MCDS | MA | TBMA | Mw | PD | | |
| P-22 | 18 | 35 | 47 | 12700 | 2.84 | 70 | 113 |
| P-23 | 22 | 36 | 42 | 16000 | 3.14 | 72 | 125 |

POLYMER EXAMPLE P-24

Synthesis of Poly(1,1,3,3-tetramethyl-1,3-disila-2-oxacyclohexane carboxylic acid methallyl ester-co-maleic anhydride-co-t-butyl acrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate In a 100 mL three neck, round bottom flask equipped with a thermocouple, condenser and a gas inlet were combined maleic anhydride (2.04 g, 20.80 mmol), 1,1,3,3-tetramethyl-1,3-disila-2-oxacyclohexane carboxylic acid methallyl ester (MCDS; 5.67 g, 20.81 mmol), t-butyl acrylate (2.29 g, 17.86 mmol) and THF (10.0 g). To the mixture was added V 601 (0.137 g, 0.59 mmol). the mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 9.

TABLE 9

| Polymer Synthesis | Composition (mol %) | | | GPC | | Yield (%) | Tg (° C.) |
|---|---|---|---|---|---|---|---|
| | MCDS | MA | TBA | Mw | PD | | |
| P-24 | 32 | 34 | 34 | 11900 | 2.48 | 65 | 104 |

POLYMER EXAMPLE P-25

Synthesis of Poly(1,1,3,3-tetramethyl-1,3-disila-2-oxacyclohexane carboxylic acid allyl ester-co-maleic anhydride-co-t-butyl acrylate In a 100 mL three neck, round bottom flask equipped with a thermocouple, condenser and a gas inlet were combined maleic anhydride (MA) (1.20 g, 12.2 mmol), 1,1,3,3-tetramethyl-1,3-disila-2-oxacyclohexane carboxylic acid allyl ester (ACDS) (3.17 g, 12.3 mmol), t-butyl acrylate (TBA) (1.62 g, 12.6 mmol) and toluene (9.00 g). To the mixture was added Vazo® 67 (0.22 g, 1.1 mmol) in 0.5 g of toluene. The mixture was polymerized and isolated according to the General Polymerization Procedure except that the mixture was heated with stirring to 85° C. The resulting polymer solution was precipitated in hexanes (100 mL). The suspension was filtered using a Buchner funnel and washed with hexanes (2×25 mL). Analytical and other data can be found in Table 10.

TABLE 10

| Polymer Synthesis # | Composition (mol %) | | | GPC | | Yield (%) | Tg (° C.) |
|---|---|---|---|---|---|---|---|
| | ACDS | MA | TBA | Mw | PD | | |
| P-25 | 21 | 39 | 40 | 8600 | 2.97 | 52 | 86 |

POLYMER EXAMPLE P-26

Synthesis of Poly(1,1,3,3-tetramethyl-1,3-disila-2-oxacyclohexane carboxylic acid allyl ester-co-maleic anhydride-co-t-butyl methacrylate-co-3-(3,5,7,9,11,13,15-heptaethylpentacyclo [9.5.1.1$^{3,9}$.1$^{5,15}$.1$^{7,13}$]octa-siloxan-1-yl)propyl methacrylate In a 100 mL three neck, round bottom flask equipped with a thermocouple, condenser and a gas inlet were combined maleic anhydride (2.68 g, 27.32 mmol), 1,1,3,3-tetramethyl-1,3-disila-2-oxacyclohexane carboxylic acid allyl ester (ACDS; 5.20 g, 20.12 mmol), t-butyl methacrylate (4.12 g, 28.97 mmol), methacrylEthyl-POSS (3.0 g, 4.01 mmol) and toluene (15.0 g). To the mixture was added Vazo® 67 (0.45 g, 2.39 mmol) and 0.13 g of 1-dodecanethiol the mixture was polymerized and isolated according to the General Polymerization Procedure. The resulting polymer solution was precipitated in hexanes (100 mL). The suspension was filtered using a Buchner funnel and washed with hexanes (2×25 mL). Analytical and other data can be found in Table 11.

POLYMER EXAMPLE P-27

Synthesis of Poly(1,1,3,3-tertamethyl-1,3-disila-2-oxacyclohexane carboxylic acid allyl ester-co-maleic anhydride-co-t-butyl methacrylate-co-3-(3,5,7,9,11,13,15-heptaethylpentacyclo[9.5.1.1$^{3,9}$.1$^{5,15}$.1$^{7,13}$]octa-siloxan-1-yl)propyl methacrylate In a 500 mL three neck, round bottom flask equipped with a thermocouple, condenser and a gas inlet was combined maleic anhydride (23.44 g, 239.0 mmol), 1,1,3,3-tertamethyl-1,3-disila-2-oxacyclohexane carboxylic acid allyl ester (51.48 g, 199.2 mmol), t-butyl methacrylate (45.32 g, 318.7 mmol), methacrylEthyl-POSS (29.77 g, 39.8 mmol) and toluene (150.0 g). The mixture was stirred under a N$_2$ atmosphere until all the maleic anhydride was dissolved. To the mixture was added Vazo® 67 (4.59 g, 23.9 mmol) and 1.38 g of 1-dodecanethiol. The mixture was polymerized and isolated according to the General Polymerization Procedure. The resulting polymer solution was precipitated in heptane (2.3 L). The suspension was filtered using a Buchner funnel and washed with hexanes (2×250 mL). Analytical and other data can be found in Table 11.

TABLE 11

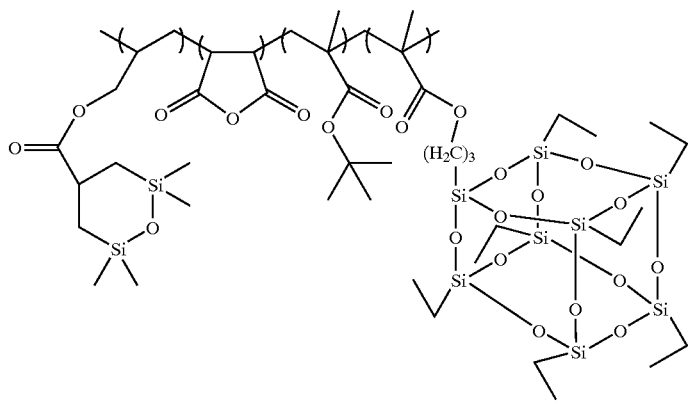

| Polymer Synthesis # | Composition (mol %) | | | | GPC | | Yield (%) | Tg (° C.) |
|---|---|---|---|---|---|---|---|---|
| | ACDS | MA | TBMA | T8MA | Mw | PD | | |
| P-26 | 16 | 30 | 48 | 6 | 19582 | 3.02 | 33 | 104 |
| P-27 | 15 | 24 | 55 | 6 | 16510 | 3.28 | 50 | 110 |

The photo-acid generating agents and photodecomposable bases (PDB) given in Tables 12 and 13 were used in the Lithographic Formulation Examples.

TABLE 12

| Structure | PAG | Name |
|---|---|---|
| (structure with C$_8$F$_{17}$SO$_3^-$) | PAG 1 | 2,4,6-trimethylphenyl diphenylsulfonium perfluorooctane sulfonate |
| nBuO-(structure) C$_8$F$_{17}$SO$_3^-$ | PAG 2 | 4-(1-butoxyphenyl) diphenylsulfonium perfluorooctane sulfonate |

TABLE 12-continued

| Structure | PAG | Name |
|---|---|---|
| 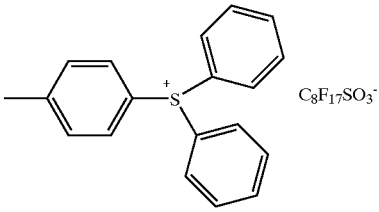 C$_8$F$_{17}$SO$_3^-$ | PAG 3 | 4-methylphenyl diphenylsulfonium perfluorooctane sulfonate |
| 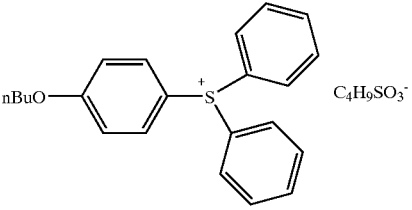 C$_4$H$_9$SO$_3^-$ | PAG 4 | 4-(1-butoxyphenyl) diphenylsulfonium perfluorobutane sulfonate |
| 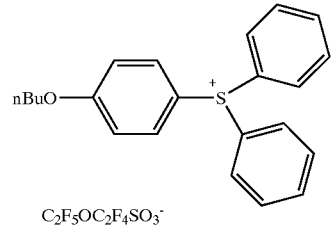 C$_2$F$_5$OC$_2$F$_4$SO$_3^-$ | PAG 5 | 4-(1-butoxyphenyl) diphenylsulfonium perfluoro-(2-ethoxyethane) sulfonate |
| 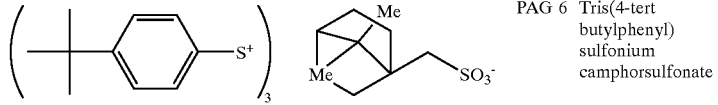 | PAG 6 | Tris(4-tert butylphenyl) sulfonium camphorsulfonate |

TABLE 13

| STRUCTURE | PDB | NAME |
|---|---|---|
| 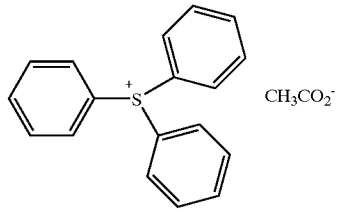 CH$_3$CO$_2^-$ | PDB1 | triphenylsulfonium acetate |
| 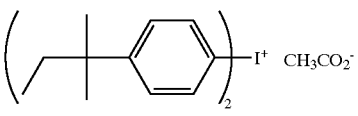 CH$_3$CO$_2^-$ | PDB2 | Bis(4-tert-amyl phenyl)iodonium acetate |
| 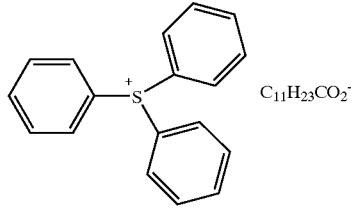 C$_{11}$H$_{23}$CO$_2^-$ | PDB3 | triphenylsulfonium laurate |

General Formulation Procedure

Photoresist components as described in the Lithographic Examples were mixed in an amber bottle and rolled until all components were dissolved. The solution was filtered through a 0.2 μm filter into a clean amber bottle.

LITHOGRAPHIC EXAMPLE 1

The formulation for Lithographic Example 1 was prepared as described in the General Formulation Procedure using 3.46 g of Poly(1,1,3,3-tetramethyl-1,3-disila-2-oxacyclohexane carboxylic acid allyl ester-co-maleic anhydride-co-t-butyl acrylate) (polymer P-1), 0.203 g of PAG 3, 0.012 g of 1,8-diazabicyclo[5,4,0]undec-7-ane and 46.33 g of propylene glycol methyl ether acetate (PGMEA).

To lithographically evaluate the formulation, silicon wafers were spin coated with a thermally curable undercoat and post apply baked at 200° C. for 60 seconds giving a 2100 Å film thickness. The undercoat composition was similar to those described in U.S. Pat. No. 6,323,287. The formulation for Lithographic Example 1 was spin coated over the undercoat and post apply baked at 130° C. for 60 seconds giving a 1700 Å film thickness. The coated wafers were then exposed using an ISI 9300 microstepper using annular illumination (0.6NA, 0.8/0.6 annular) to print dense and isolated trenches as well as dense and isolated contact holes. The exposed, coated wafers were post exposure baked at 120° C. for 60 seconds and developed for 60 seconds using 0.262 N tetramethyl ammonium hydroxide solution. The developed coated wafers were then rinsed with de-ionized water and spun dry.

The images were analyzed by cross sectional scanning electron microscopy. The imaging layer was evaluated by examining resolution from 0.15 μm to the resolution limit. The ultimate resolution for the imaging layer described above was 0.11–0.1075 μm for dense trench features, and 0.14–0.13 μm for contact holes. Properly sized 120 nm dense trenches had a depth of focus of 0.75–0.9 μm. Properly sized 130 nm dense contact holes had a depth of focus of 0.5–0.6 μm.

LITHOGRAPHIC EXAMPLE 2

The formulation for Lithographic Example 2 was prepared as described in the General Formulation Procedure using 3.46 g of Poly(1,1,3,3-tetramethyl-1,3-disila-2-oxacyclohexane carboxylic acid vinyloxyethyl ester-co-maleic anhydride-co-t-butyl methacrylate) (polymer P-3), 0.203 g of PAG 3, 0.012 g of 1,8-diazabicyclo[5,4,0]undec-7-ane and 46.33 g of propylene glycol methyl ether acetate (PGMEA).

The formulation for Lithographic Example 2 was lithographically processed and evaluated in the same manner as Lithographic Example 1. The ultimate resolution for the imaging layer described above was 0.11 μm for dense trench features, and 0.14 μm for contact holes. Properly sized 120 nm dense trenches had a depth of focus of 0.6 μm. Properly sized 130 nm dense contact holes had a depth of focus of 0.5 μm.

General Lithographic Procedure

Silicon wafers were first spun-coated with undercoats of the type described in U.S. Provisional Application No. 60/552,489 and baked for 70 seconds at 205° C. to yield an underlayer thickness of 210 nm or 400 nm. The resist samples were then applied over the underlayer and post-apply baked (PAB) for 60 seconds at various temperatures, depending on the resist sample, resulting in a resist film thickness of 170 nm. The resist samples were then exposed pattern-wise with an ArF eximer laser beam (193 nm) in an ISI 9300 through a photomask containing line and space patterns. A numerical aperture of 0.6 was utilized with a 0.8/0.6 annular illumination setting. The exposed resist coated wafers were then subjected to post-exposure bake (PEB) treatment on a hotplate for 60 seconds [temperature varied depending on the experiment]. Then the baked wafers were subjected to a sixty second puddle development process with a 0.262N solution of tetramethylammonium hydroxide. The developer was removed from the developed wafer by rinsing for 30 seconds with DI water and the wafer was spun dry. Wafers were then sheared cross-sectionally across the photoresist relief images formed during the above processes. The data were collected using a Hitachi scanning electron microscope at a magnification of 100 k times.

LITHOGRAPHIC EXAMPLES 3–7

Formulations for Lithographic Examples 3–7 were prepared as described in the General Formulation Procedure using PAG 1 (0.064 grams), 1,8-diazobicyclo[5.4.0]undec-7-ene (DBU; 0.0036 grams), PGMEA (13.84 grams) and polymer (1.09 g). Each formulation employed a different polymer. Lithographic Example 3 employed P-1, Lithographic Example 4 employed P-25, Lithographic Example 5 employed P-3, Lithographic Example 6 employed P-8, and Lithographic Example 7 employed P-10.

The formulations were lithographically evaluated using the General Lithographic Procedure except for Lithographic Examples 3 and 4—which used 0.7 conventional sigma-illumination. The wafers were examined by scanning electron microscope for photospeed, resolution, depth of focus (DOF), and profile shape. The results are given in Lithographic Table 1 with the corresponding post-apply (PAB) bake and post-exposure bake (PEB) temperatures employed. Energy to size (Esize) in Table 2 refers to the energy to resolve 130 nm line/space patterns with equal line and space width (measuring the line) for Lithographic Examples 3 and 4 and 120 nm line/space patterns with equal line and space width (measuring the space) for Lithographic Examples 5–7.

Lithographic Table 1

| Example | PAB/ PEB (° C.) | Esize (mj/cm²) | Resolution (μm) | DOF (μm) | Profile Description |
|---|---|---|---|---|---|
| 3 | 110/110 | 51 | 0.12 | 0.45 | Rounded top, slight slope to sidewall, slight footing |
| 4 | 105/105 | 70 | 0.12 | 0.45 | Rounded top, sloped sidewall, footing |
| 5 | 125/120 | 48 | 0.11 | 0.45 | Rounded top, sloped sidewall, footing |
| 6 | 125/120 | 65 | 0.105 | 0.9 | Slightly rounded top, sloped sidewall, footed |
| 7 | 125/120 | 59 | 0.105 | 1.05 | Slightly rounded top, slightly sloped sidewall, footed |

LITHOGRAPHIC EXAMPLES 8–12

Formulations for Lithographic Examples 8–12 were prepared as described in the General Formulation Procedure using a blend of PAG 1(0.017 grams) and PAG 3 (0.0495 grams), 1,8-diazobicyclo[5.4.0]undec-7-ene (DBU; 0.0036 grams), and PGMEA (13.84 grams) and polymer (0.922 grams). Each formulation employed a different polymer. Lithographic Example 8 employed P-14, Lithographic Example 9 employed P-17, Lithographic Example 10 employed P-19, Lithographic Example 11 employed P-26, and Lithographic Example 12 employed P-18.

The formulations for Lithographic Examples 8–12 were lithographically evaluated using the General Lithographic procedure. The wafers were examined by scanning electron microscope for photospeed, resolution, depth of focus (DOF), exposure latitude (EL), mask error factor (MEF), and profile shape. The results are given in Lithographic Table 2 with the corresponding post-apply (PAB) bake and post-exposure bake (PEB) temperatures employed. Energy to size (Esize) in Lithographic Table 2 refers to the energy to resolve 120 nm line/space patterns with equal line and space width (measuring the space).

Lithographic Table 2

| Example | PAB/PEB (° C.) | Esize (mj/cm²) | Resolution (μm) | DOF (μm) | EL (%) | MEF | Profile Description |
|---|---|---|---|---|---|---|---|
| 8 | 125/115 | 55 | 0.11–0.1075 | 1.2 | 6.6 | 6.2 | Slightly cuspy top, slightly sloped sidewall, slightly footed |
| 9 | 115/115 | 62 | 0.105–0.1075 | 1.2–1.35 | 6.6 | 2.7 | Slightly rounded top, sloped sidewall, footed |
| 10 | 115/115 | 74 | 0.105 | 1.35 | 4.6 | 3.2 | Slightly rounded top, sloped sidewall, footed |
| 11 | 115/115 | 75 | 0.1075 | 0.105 | 6.1 | 3 | Rounded top, sloped sidewall, footing |
| 12 | 115/115 | 63 | 0.105 | 1.35–1.5 | 6.3 | 3.3 | Slightly rounded top, sloped sidewall, footed |

LITHOGRAPHIC EXAMPLES 13–18

Formulations for Lithographic Examples 13–18 were prepared as described in the General Formulation Procedure using polymer P-11, various PAGS, additives, and solvents described in Lithographic Table 3. The formulation for Lithographic Example 16 also contained 5.56 g of gamma-butyrolactone as a co-solvent. Formulations for Lithographic Examples 13–18 were lithographically evaluated using the General Lithographic Procedure. The wafers were examined by scanning electron microscope for photospeed, resolution, depth of focus (DOF), and profile shape. The results are given in Lithographic Table 4 with the corresponding post-apply (PAB) bake and post-exposure bake (PEB) temperatures employed. Energy to size (Esize) in Lithographic Table 4 refers to the energy to resolve 120 nm line/space patterns with equal line and space width (measuring the space).

Lithographic Table 3

| Example | Polymer Amount (g) | PAG 1 Amount (g) | Co-PAG or PDB/ Amount (g) | Basic Additive/ Amount (g) | PGMEA/ Amount (g) |
|---|---|---|---|---|---|
| 13 | 0.83 | 0.494 | PDB2/0.0066 | DBU/0.0007 | 11.12 |
| 14 | 0.82 | 0.0494 | PAG 6/0.0088 | DBU/0.0007 | 11.12 |
| 15 | 0.83 | 0.0494 | PDB3/0.0064 | DBU/0.0007 | 11.11 |
| 16 | 0.83 | 0.0123 | PAG 3/0.0357 | DBU/0.0028 | 5.56 |
| 17 | 0.82 | 0.0147 | PAG 3/0.0423 | DBU/0.0033 | 11.12 |
| 18 | 0.81 | 0.0147 | PAG 3/0.0423 | Tridodecylamine/0.0114 | 11.12 |

Lithographic Table 4

| Example | PAB/PEB (° C.) | Esize (mj/cm²) | Resolution (μm) | DOF (μm) | Profile Description |
|---|---|---|---|---|---|
| 13 | 130/120 | 52 | 0.12 | 0.75–0.9 | flat top, vertical sidewall, undercut |
| 14 | 130/120 | No data | No data | No data | No data |
| 15 | 130/120 | 42 | 0.12–0.11 | 1.05 | flat top, vertical sidewall, slightly undercut |
| 16 | 130/120 | 44 | 0.12–0.11 | 0.9 | flat top, vertical sidewall, clean interface |
| 17 | 130/120 | 40 | 0.11 | 1.2 | Slightly cuspy top, slightly sloped sidewall, slightly footed |
| 18 | 130/120 | 37 | 0.11 | 1.05 | Flat top, sloped sidewall, footed |

LITHOGRAPHIC EXAMPLES 19–22

Formulations for Lithographic Examples 19–22 were prepared as described in the General Formulation Procedure using polymer P-7 and the components, and amounts described in Lithographic Table 5. Formulations for examples 19–22 were lithographically evaluated using the General Lithographic Procedure. The wafers were examined by scanning electron microscope for photospeed, resolution, depth of focus (DOF), exposure latitude (EL) and profile shape. The results are given in Table 6 with the corresponding post-apply (PAB) bake and post-exposure bake (PEB) temperatures employed. Energy to size (Esize) in Lithographic Table 6 refers to the energy to resolve 120 nm line/space patterns with equal line and space width (measuring the space).

Lithographic Table 5

| Example | Polymer Amount (g) | PAG | PAG Amount (g) | DBU Amount (g) | PGMEA Amount (g) |
|---|---|---|---|---|---|
| 19, 20 | 0.33 | PAG 2 | 0.0201 | 0.0011 | 4.654 |
| 21, 22 | 0.33 | PAG 3 | 0.0187 | 0.0011 | 4.654 |

Lithographic Table 6

| Example | PAB/PEB (° C.) | Esize (mj/cm$^2$) | Resolution ($\mu$m) | DOF ($\mu$m) | EL (%) | Profile Description |
|---|---|---|---|---|---|---|
| 19 | 135/125 | 43 | 0.11 | 0.9 | 15 | Flat top, sloped sidewall, footed |
| 20 | 125/120 | 47 | 0.11 | 1.05 | 9.1 | Slightly rounded top, sloped sidewall, footed |
| 21 | 135/125 | 30 | 0.11 | 1.05 | 15.8 | Slightly rounded top, sloped sidewall, footed |
| 22 | 125/120 | 34 | 0.11 | 1.05 | 11 | Slightly rounded top, sloped sidewall, footed |

LITHOGRAPHIC EXAMPLES 23–32

Formulations for Lithographic Examples 23–32 were prepared as described in the General Formulation Procedure using polymer P-8, and components and amounts described in Lithographic Table 7. The formulation for Lithographic Example 28 also had 0.501 g of gamma-butyrolactone.

Formulations for Lithographic Examples 23–32 were lithographically evaluated using the General Lithographic Procedure. The wafers were examined by scanning electron microscope for photospeed, resolution, depth of focus (DOF), and profile shape. The results are given in Lithographic Table 8 with the corresponding post-apply (PAB) bake and post-exposure bake (PEB) temperatures employed. Energy to size (Esize) in Lithographic Table 8 refers to the energy to resolve 120 nm line/space patterns with equal line and space width (measuring the space).

Lithographic Table 7

| Example | Polymer Amount (g) | PAG/ Amount (g) | other Additive/ Amount (g) | Basic Additive/ Amount (g) | Solvent/ Amount (g) |
|---|---|---|---|---|---|
| 23 | 0.48 | PAG 2/ 0.0349 | | DBU/ 0.0024 | PGMEA/ 6.486 |
| 24 | 0.49 | PAG 4/ 0.0268 | | DBU/ 0.0024 | PGMEA/ 6.485 |
| 25 | 0.48 | PAG 5/ 0.0274 | | DBU/ 0.0024 | PGMEA/ 6.486 |
| 26 | 0.48 | PAG 2/ 0.0175 | PAG 4/ 0.0134 | DBU/ 0.0024 | PGMEA/ 6.485 |
| 27 | 0.47 | PAG 2/ 0.0349 | | Tridodecylamine/ 0.0081 | PGMEA/ 6.483 |
| 28 | 0.47 | PAG 2/ 0.0349 | PDB1/ 0.00506 | DBU/ 0.0008 | PGMEA/ 5.98 |
| 29 | 0.47 | PAG 2/ 0.0349 | Trihexylamine/ 0.0021 | Tridodecylamine/ 0.0041 | PGMEA/ 6.484 |
| 30 | 0.48 | PAG 3/ 0.0329 | | DBU/ 0.0019 | PGMEA/ 6.484 |
| 31 | 0.48 | PAG 3/ 0.0329 | | DBU/ 0.0029 | PGMEA/ 6.484 |
| 32 | 0.48 | PAG 3/ 0.0329 | | DBU/ 0.0039 | PGMEA/ 6.484 |

Lithographic Table 8

| Example | PAB/PEB (° C.) | Esize (mj/cm²) | Resolution (μm) | DOF (μm) | Profile Description |
|---|---|---|---|---|---|
| 23 | 135/125 | 57 | 0.115 | 0.75 | Flat top, sloped sidewall, footed |
| 24 | 135/125 | 61 | 0.115 | 0.6 | Slightly rounded top, sloped sidewall, footed |
| 25 | 135/125 | 64 | | | Flat top, sloped sidewall, footed |
| 26 | 135/125 | 61 | 0.115 | 0.75–0.9 | Slightly rounded top, sloped sidewall, footed |
| 27 | 135/125 | 54 | 0.11 | 0.75 | Flat top, sloped sidewall, footed |
| 28 | 135/125 | 45 | 0.115 | 0.9 | Slightly rounded top, sloped sidewall, footed |
| 29 | 135/125 | 42 | 0.115 | 0.9 | Severe film loss, footed |
| 30 | 135/125 | 33 | 0.11–0.105 | 0.9 | Slightly rounded top, sloped sidewall, footed |
| 31 | 135/125 | 52 | 0.11 | 1.05 | Slightly rounded top, slightly sloped sidewall, slightly footed |
| 32 | 135/125 | 81 | 0.11 | 1.05–1.2 | Rounded top, sloped sidewall, footed |

LITHOGRAPHIC EXAMPLES 33 AND 34

Formulations for Lithographic Examples 33 and 34 were prepared as described in the General Formulation Procedure using 1.38 grams of polymer P-9, 0.0813 grams of PAG 1, 0.0073 grams of triphenylsulfonium acetate (PDB1, 0.0012 grams of DBU, 17.81 grams of PGMEA, and 0.726 grams of gamma-butyrolactone.

Formulations for Lithographic Examples 33 and 34 were lithographically evaluated using the General Lithographic Procedure except that instead of using TIS193UL-52–50 for the underlayer, two other underlayer formulations were used. The wafers were examined by scanning electron microscope for photospeed, resolution, depth of focus (DOF), and profile shape. The results are given in Table 9 with the corresponding post-apply (PAB) bake and post-exposure bake (PEB) temperatures employed. Energy to size (Esize) in Table 9 refers to the energy to resolve 120 nm line/space patterns with equal line and space width (measuring the space).

TABLE 9

| Example | PAB/PEB (° C.) | Esize (mj/cm²) | Resolution (μm) | DOF (μm) | Profile Description |
|---|---|---|---|---|---|
| 33 | 130/120 | 41 | 0.11 | 1.05 | Slightly rounded top, slightly sloped sidewall, slightly footed |
| 34 | 130/120 | 38 | 0.115–0.11 | 0.9–1.05 | Flat top, vertical sidewall, clean interface |

LITHOGRAPHIC EXAMPLES 35 AND 36

Formulations for Lithographic Examples 35 and 36 were prepared as described in the General Formulation Procedure. The formulation for Lithographic Example 35 contained 1.09 grams of polymer P-1. Lithographic Example 35 contained 1.09 grams of polymer P-6. Both formulations also contained 0.064 grams of PAG 1, 0.0036 grams of DBU, and 13.84 grams of PGMEA.

The formulations for Lithographic Examples 35 and 36 were lithographically evaluated using the General Lithographic Procedure except conventional sigma of 0.7 was used instead of the annular illumination scheme described. The wafers were examined by scanning electron microscope for photospeed, resolution, depth of focus (DOF), and profile shape. The results are given in Table 10 with the corresponding post-apply (PAB) bake and post-exposure bake (PEB) temperatures employed. Energy to size (Esize) in Lithographic Table 10 refers to the energy to resolve 150 nm contact hole patterns with equal contact hole and space width (measuring the contact hole).

Lithographic Table 10

| Example | PAB/PEB (° C.) | Esize (mj/cm²) | Resolution (μm) | DOF (μm) | Profile Description |
|---|---|---|---|---|---|
| 35 | 110/110 | 112 | 0.15 | 0.6 | Slightly rounded top, slightly sloped sidewall |
| 36 | 125/120 | 103 | 0.14 | 0.6 | Flat top, slightly sloped sidewall |

LITHOGRAPHIC EXAMPLES 37 AND 38

Formulations for Lithographic Examples 37 and 38 were prepared as described in the General Formulation Procedure. The formulation for Lithographic Example 37 contained 1.38 grams of polymer P-9. The formulation for Lithographic Example 37 contained 1.38 grams of polymer P-12. Both formulations also contained 0.0813 grams of PAG 1, 0.0073 grams of triphenylsulfonium acetate (PDB1), 0.0012 grams of DBU, 17.81 grams of PGMEA, and 0.726 grams of gamma-butyrolactone.

The formulations for Lithographic Examples 37 and 38 were lithographically evaluated using the General Lithographic Procedure. The wafers were examined by scanning electron microscope for photospeed, resolution, depth of focus (DOF), and profile shape. The results are given in Table 11 with the corresponding post-apply (PAB) bake and post-exposure bake (PEB) temperatures employed. Energy to size (Esize) in Lithographic Table 11 refers to the energy to resolve 150 nm contact hole patterns with equal contact hole and space width (measuring the contact hole).

Lithographic Table 11

| Example | PAB/PEB (° C.) | Esize (mj/cm$^2$) | Resolution ($\mu$m) | DOF ($\mu$m) | Profile Description |
|---|---|---|---|---|---|
| 37 | 130/120 | 70 | 0.15 | 0.45 | Flat top, sloped sidewall, clean interface |
| 38 | 130/120 | 78 | 0.14 | 0.3 | Flat top, vertical sidewall, clean interface |

LITHOGRAPHIC EXAMPLES 39 AND 40

The formulations for Lithographic Examples 39 and 40 were prepared as described in the General Formulation Procedure. Both formulations contained 0.86 grams of polymer P-15, 0.0618 grams of PAG 3, 0.0036 grams of DBU. The formulation for Lithographic Example 39 also contained 5.54 grams PGMEA, and 5.54 grams 2-Heptanone. The formulation for Lithographic Example 40 also contained 8.31 grams of PGMEA and 2.77 grams of 2-Heptanone.

The formulations for Lithographic Examples 39 and 40 were lithographically evaluated using the General Lithographic Procedure. The wafers were examined by scanning electron microscope for photospeed, resolution, depth of focus (DOF), and profile shape. The results are given in Lithographic Table 12 with the corresponding post-apply (PAB) bake and post-exposure bake (PEB) temperatures employed. Energy to size (Esize) in Lithographic Table 12 refers to the energy to resolve 120 nm line/space patterns with equal line and space width (measuring the space).

Lithographic Table 12

| Example | PAB/PEB (° C.) | Esize (mj/cm$^2$) | Resolution ($\mu$m) | DOF ($\mu$m) | Profile Description |
|---|---|---|---|---|---|
| 39 | 125/115 | 47 | 0.1075 | 0.75 | Slightly cuspy top, slightly sloped sidewall, slightly footed |
| 40 | 125/115 | 49 | 0.1075 | 1.05–1.2 | Slightly cuspy top, slightly sloped sidewall, slightly footed |

LITHOGRAPHIC EXAMPLES 41–44

The formulations for Lithographic Examples 41–44 were prepared as described in the General Formulation Procedure using a blend of PAG 1 and PAG 3, polymer, 1,8-diazobicyclo[5.4.0]undec-7-ene (DBU), and PGMEA in the amounts described in Lithographic Table 13. The formulation for Lithographic Experiment 41 employed polymer P-22. Lithographic Experiment 42 employed polymer P-21. Lithographic Experiment 43 employed polymer P-23. Lithographic Experiment 44 employed polymer P-24.

Formulations for Lithographic Examples 41–44 were lithographically evaluated using the General Lithographic procedure. The wafers were examined by scanning electron microscope for photospeed, resolution, depth of focus (DOF), exposure latitude (EL), mask error factor (MEF), and profile shape. The results are given in Lithographic Table 14 with the corresponding post-apply (PAB) bake and post-exposure bake (PEB) temperatures employed. Energy to size (Esize) in Table 14 refers to the energy to resolve 120 nm line/space patterns with equal line and space width (measuring the space).

Lithographic Table 13

| Example | Polymer Amount (g) | PAG 1 Amount (g) | PAG 3 Amount (g) | DBU Amount (g) | PGMEA Amount (g) |
|---|---|---|---|---|---|
| 41 | 1.02 | 0.019 | 0.055 | 0.0043 | 13.89 |
| 42 | 3.07 | 0.0507 | 0.165 | 0.013 | 41.69 |
| 43 | 1.71 | 0.0317 | 0.0916 | 0.0072 | 23.16 |
| 44 | 1.71 | 0.0317 | 0.0916 | 0.0072 | 23.16 |

Lithographic Table 14

| Example | PAB/PEB (° C.) | Esize (mj/cm$^2$) | Resolution ($\mu$m) | DOF ($\mu$m) | EL (%) | MEF | Profile Description |
|---|---|---|---|---|---|---|---|
| 41 | 125/115 | 38 | 0.11–0.1075 | >1.0 | 7.1 | 2.84 | Slightly rounded top, slightly sloped sidewall, slightly footed |
| 42 | 125/115 | 42 | 0.11 | 1.35 | 6.6 | 3.6 | Rounded top, severe roughness |
| 43 | 125/115 | 37 | no data | 1.5 | 10.8 | 3.1 | Slightly rounded top, slightly sloped sidewall, slightly footed |
| 44 | 115/115 | 38.25 | 0.11–0.1075 | 0.6 | 5.9 | 5.1 | flat top, vertical sidewall, clean interface |

LITHOGRAPHIC EXAMPLES 45 AND 46

The formulations for Lithographic Examples 45 and 46 were prepared as described in the General Formulation Procedure using a blend of PAG 1 and PAG 3, polymer, 1,8-diazobicyclo[5.4.0]undec-7-ene (DBU), and PGMEA in the amounts described in Lithographic Table 15. Lithographic employment 45 employed polymer P-12. Lithographic Experiment 46 employed polymer P-14.

The formulations for Lithographic Examples 45 and 46 were lithographically evaluated using the General Lithographic procedure except exposures were done on an ASML/1100 scanner with an NA of 0.75 and 0.75/0.5 annular illumination. Also the reticle was 9% attenuated phases-shift. Results were not attained through cross-sectional SEM. Instead a top-down (CD) SEM was used. The wafers were examined by CD SEM microscope for photospeed, resolution, depth of focus (DOF), exposure latitude (EL), and mask error factor (MEF). The results are given in Lithographic Table 16 with the corresponding post-apply (PAB) bake and post-exposure bake (PEB) temperatures employed. In these examples the PAB and PEB bake times were 90 seconds. Energy to size (Esize) in Lithographic Table 16 refers to the energy to resolve 100 nm line/space patterns with equal line and space width (measuring the space).

Lithographic Table 15

| Example | Polymer Amount (g) | PAG 1 Amount (g) | PAG 3 Amount (g) | DBU Amount (g) | PGMEA Amount (g) |
|---|---|---|---|---|---|
| 45 | 1.05 | 0.0187 | 0.0504 | 0.0042 | 13.87 |
| 46 | 4.32 | 0.0803 | 0.2319 | 0.0182 | 55.35 |

Lithographic Table 16

| Example | PAB/PEB (° C.) | Esize (mj/cm$^2$) | DOF (μm) | EL (%) | MEF |
|---|---|---|---|---|---|
| 45 | 135/120 | 31.8 | 0.54 | 11.8 | 4.2 |
| 46 | 125/110 | 43.6 | 0.48 | 6.8 | 5.1 |

LITHOGRAPHIC EXAMPLES 47 AND 48

Formulations for Lithographic Examples 47 and 48 were prepared as described in the General Formulation Procedure. Both examples contained 1.04 grams of polymer P-7, 0.061 grams of PAG 1, 0.0035 grams of DBU and 13.9 grams of PGMEA.

The formulations for Lithographic Examples 47 and 48 were lithographically evaluated using the General Lithographic Procedure. The wafers were examined by scanning electron microscope for photospeed, resolution, depth of focus (DOF), Exposure Latitude (EL) and profile shape. The results are given in Lithographic Table 17 with the corresponding post-apply (PAB) bake and post-exposure bake (PEB) temperatures employed. Energy to size (Esize) in Table 17 refers to the energy to resolve 120 nm line/space patterns with equal line and space width (measuring the space).

Lithographic Table 17

| Example | PAB/PEB (° C.) | Esize (mj/cm$^2$) | Resolution (μm) | DOF (μm) | EL (%) | Profile Description |
|---|---|---|---|---|---|---|
| 47 | 135/125 | 53 | 0.11 | 1.05 | 16 | Flat top, sloped sidewall, footed |
| 48 | 125/120 | 59 | 0.105 | 0.9 | 6.2 | Rounded top, sloped sidewall, footed |

LITHOGRAPHIC EXAMPLES 49–51

The formulations for Lithographic Examples 49–51 were prepared as described in the General Formulation Procedure using the components described in Lithographic Table 18. The formulation for Lithographic Experiment 50 also had 0.573 g gamma-butyrolactone.

The formulations for Lithographic Examples 49–51 were lithographically evaluated using the General Lithographic Procedure. The wafers were examined by scanning electron microscope for photospeed, resolution, depth of focus (DOF), Exposure Latitude (EL), Mask Error Factor (MEF) and profile shape. The results are given in Lithographic Table 19 with the corresponding post-apply (PAB) bake and post-exposure bake (PEB) temperatures employed. Energy to size (Esize) in Lithographic Table 19 refers to the energy to resolve 120 nm line/space patterns with equal line and space width (measuring the space).

Lithographic Table 18

| Example | Polymer/ Amount (g) | PAG/ Amount (g) | Co-PAG or Additive/ Amount (g) | Basic Additive/ Amount (g) | Solvent/ Amount (g) |
|---|---|---|---|---|---|
| 49 | P-13/ 1.05 | PAG 1/ 0.0187 | PAG 3/ 0.054 | DBU/ 0.0042 | PGMEA/ 13.872 |
| 50 | P-16/ 0.86 | PAG 1/ 0.0642 | PDB1/ 0.0058 | DBU/ 0.0009 | PGMEA/ 10.494 |
| 51 | P-20/ 1.05 | PAG 3/ 0.0731 | | DBU/ 0.0055 | PGMEA/ 13.873 |

Lithographic Table 19

| Example | PAB/PEB (° C.) | Esize (mj/cm$^2$) | Resolution (μm) | DOF (μm) | EL (%) | MEF | Profile Description |
|---|---|---|---|---|---|---|---|
| 49 | 130/120 | 44 | 0.115–0.11 | 0.9–1.05 | 5.1 | | Flat top, sloped sidewall, clean interface |
| 50 | 125/115 | 48 | 0.1075–0.105 | 0.9–1.05 | | >4 | Cuspy top, vertical sidewall, slightly footed |
| 51 | 115/115 | 46 | 0.1075 | 1.2 | 6 | 5.1 | Rounded top, slightly sloped sidewall, slightly footed |

LITHOGRAPHIC EXAMPLE 52–53

The formulation for Lithographic Example 52 was prepared as described in the General Formulation Procedure using 14.38 g of polymer P-11, 0.257 g of PAG 1, 0.741 g of PAG 3, 0.058 g of 1,8-diazabicyclo[5,4,0]undec-7-ane and 194.56 g of propylene glycol methyl ether acetate (PGMEA). The formulation for Lithographic Example 53 was prepared as described in the General Formulation Procedure using 17.07 g of polymer P-27, 0.317 g of PAG 1, 0.917 g of PAG 3, 0.072 g of 1,8-diazabicyclo[5,4,0]undec-7-ane and 231.62 g of propylene glycol methyl ether acetate (PGMEA).

To lithographically evaluate the formulation, silicon wafers were spin coated with a thermally curable undercoat and post apply baked at 205° C. for 90 seconds giving a 4000 Å film thickness. The undercoat composition was of the type described in U.S. Provisional Application No. 60/552,489. The formulation for Lithographic Example 52 was spin coated over the undercoat and post apply baked at 125° C. for 90 seconds giving a 1700 Å film thickness. The formulation for Lithographic Example 53 was spin coated over the undercoat and post apply baked at 135° C. for 90 seconds giving a 1700 Å film thickness. The coated wafers were then exposed through a 9% attenuated phase-shift reticle using an ASML/1100 scanner with a numerical aperture of 0.75 and 0.89/0.59 Quasar Illumination to print dense trenches. The exposed wafers were post exposure baked at 115° C. for 90 seconds for Lithographic Example 52 and 110° C. for 90 seconds for Lithographic Example 53. Both were developed for 60 seconds using 0.262 N tetramethyl ammonium hydroxide solution. The developed wafers were then rinsed with de-ionized water and spun dry.

The wafers were examined top-down by CD SEM for photospeed, depth of focus (DOF), and exposure latitude (EL). Properly sized 100 nm dense trenches required an exposure dose of 31.8 mj/cm2, had a depth of focus of 0.44 μm, and 11% Exposure Latitude (EL) for Lithographic Example 52. Properly sized 100 nm dense trenches required an exposure dose of 48.4 mj/cm2, had a depth of focus of 0.78 μm, and 14.3% Exposure Latitude (EL) for Lithographic as well as a Mask Error Factor (MEF) of 3 for Example 53.

After top-down by CD SEM evaluation, the wafers were subjected to etch in a plasma reactor to etch away the undercoat in the developed areas using an etch gas mixture with one of the etch gases being an oxygen source. After the etch process, wafers were then sheared cross-sectionally across the photoresist relief images formed during the above processes. The data was collected using a Hitachi scanning electron microscope at a magnification of 100 k times. Lithographic Examples 52 and 53 formed 100 nm equal lines and spaces with near vertical profiles.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A polymer having monomeric units obtained on polymerizing through an unsaturated group $R^1$ of the monomer of Structure I

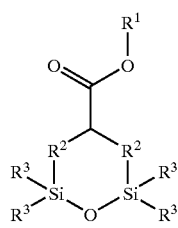

Structure I wherein $R^1$ is a moiety containing an ethylenically unsaturated polymerizable group, each $R^2$ is independently a $C_1$–$C_3$ alkylene group, and each $R^3$ is independently selected from the group consisting of a $C_{1-10}$ linear or cyclic alkyl group, a $C_{6-10}$ aromatic or substituted aromatic group, a $C_{1-8}$ alkoxy methyl, and a $C_{1-8}$ alkoxy ethyl group.

2. A polymer of claim 1 wherein the monomer of structure 1 is selected from the group consisting of 1,1,3,3-tetramethyl-1,3-disila-2-oxacyclohexane-carboxylic acid allyl ester, 1,1,3,3-tetramethyl-1,3-disila-2-oxacyclohexane-carboxylic acid butenyl ester, 1,1,3,3-tetramethyl-1,3-disila-2-oxacyclohexane-carboxylic acid vinyloxyethyl ester, and 1,1,3,3-tetramethyl-1,3-disila-2-oxacyclohexane-carboxylic acid β-methallyl ester.

3. A polymer comprising a co-polymer having monomeric units obtained on polymerizing through an unsaturated group $R^1$ of a monomer of Structure I

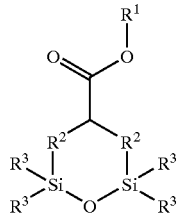

Structure I wherein $R^1$ is a moiety containing an ethylenically unsaturated polymerizable group, each $R^2$ is independently a $C_1$–$C_3$ alkylene group, and each $R^3$ is independently selected from the group consisting of a $C_{1-10}$ linear or cyclic alkyl group, a $C_{6-10}$ aromatic or substituted aromatic group, a $C_{1-8}$ alkoxy methyl, and a $C_{1-8}$ alkoxy ethyl group, and monomeric units obtained by polymerizing an acid-sensitive ethylenically unsaturated polymerizable monomer.

4. A polymer according to claim 3 wherein the monomer of Structure I is selected from the group consisting of 1,1,3,3-tetramethyl-1,3-disila-2-oxacyclohexane-carboxylic acid allyl ester, 1,1,3,3-tetramethyl-1,3-disila-2-oxacyclohexane-carboxylic acid butenyl ester, 1,1,3,3-tetramethyl-1,3-disila-2-oxacyclohexane-carboxylic acid vinyloxyethyl ester, and 1,1,3,3-tetramethyl-1,3-disila-2-oxacyclohexane-carboxylic acid β-methallyl ester.

5. A polymer according to claim 4 wherein the acid sensitive ethylenically unsaturated polymerizable monomer is selected from the group consisting of a monomer of Structure II, III, and IV

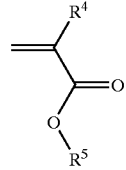

Structure II

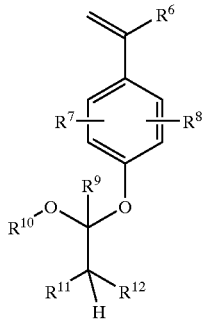

Structure III

-continued

Structure IV

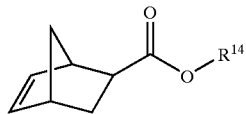

wherein $R^4$ is selected from the group consisting of hydrogen, $C_{1-3}$ alkyl group, and a $C_{1-3}$ perfluorinated alkyl group, $R^5$ is selected from the group consisting of $C_{4-20}$ branched or cyclic alkyl, and $C_{2-8}$ linear or cyclic α-alkoxy alkyl, $R^6$ is selected from the group consisting of H, $C_1$–$C_4$ lower alkyl, CN, and $CH_2CO_2R^{13}$; $R^7$ and $R^8$ are each independently selected from the group consisting of H, linear or branched $C_1$–$C_4$ alkyl, and halogen; $R^9$ is selected from the group consisting of H, and branched or linear $C_1$–$C_4$ alkyl; $R^{10}$ is selected from the group consisting of substituted or unsubstituted phenyl, a substituted or unsubstituted linear, branched or cyclic $C_1$–$C_{20}$ alkyl, optionally containing an ether or ester group, a substituted or unsubstituted phenylalkylene and a substituted or unsubstituted $C_6$–$C_{20}$ cyclic alkylene; $R^{11}$ and $R^{12}$ are independently selected from the group consisting of H, linear or branched or cyclic $C_1$–$C_{14}$ alkyl, and $C_7$–$C_{14}$ alicyclic; $R^{13}$ is selected from the group consisting of a $C_1$–$C_{14}$ branched linear or cyclic alkyl, substituted or unsubstituted phenyl, and $C_7$–$C_{14}$ alicyclic group, and $R^{14}$ is an acid cleavable protecting group that generates carboxylic acid when cleaved by acid.

6. A polymer according to claim 4 wherein the polymer additionally comprises monomeric units from polymerization of another silicon monomer having a polymerizable double bond.

7. A polymer according to claim 6 wherein the other silicon monomer is selected from the group consisting of allytrimethylsilane, vinyltrimethylsilane, methacryloxy methyltrimethylsilane, methacryloxy propyltris (trimethylsiloxy)silane, and a POSS molecule of Structure IX.

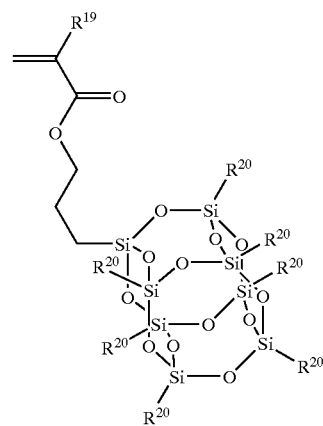

wherein $R^{19}$ is selected from the group consisting of hydrogen, a $C_{1-3}$ linear or branched alkyl group, and a linear or branched $C_{1-3}$ perfluorinated alkyl group; each $R^{20}$ is independently selected from the group consisting of hydrogen, a $C_{1-20}$ linear, branched, or a cyclic alkyl group, a $C_{7-20}$ alicyclic alkyl group, and a $C_{1-10}$ aromatic group.

8. A photosensitive composition comprising:
   a. at least one polymer;
   b. at least one photoacid generator, and
   c. at least one solvent,
wherein the at least one polymer comprises a polymer of claim 6 and the acid-sensitive ethylenically unsaturated polymerizable monomer is one of Structure II Structure II

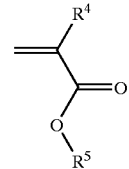

wherein $R^4$ is selected from the group consisting of hydrogen, $C_{1-3}$ alkyl group, and a $C_{1-3}$ perfluorinated alkyl group and $R^5$ is selected from the group consisting of $C_{4-20}$ branched or cyclic alkyl, and $C_{2-8}$ linear or cyclic α-alkoxy alkyl.

9. A photosensitive composition according to claim 8 wherein the at least one photoacid generator comprises a photoacid generator that generates sulfonic acid.

10. A photosensitive composition according to claim 9 wherein the at least one photoacid generator comprises a photoacid generator selected from the group consisting of iodonium and sulfonium sulfonates.

11. A photosensitive composition according to claim 10 wherein the sulfonate is a fluorinated sulfonate.

12. A process for the lithographic treatment of a substrate by means of a bilayer photoresist process, the process comprising:
   a) providing a substrate,
   b) coating in a first coating step said substrate with an undercoat solution,
   c) baking to remove solvent,
   d) coating in a second coating step a photosensitive composition of claim 8 over the undercoat to produce a bilayer photoresist stack,
   e) exposing the bilayer resist stack,
   f) developing the photosensitive composition portion of the bilayer photoresist stack making a portion of the underlying undercoat visible,
   g) rinsing the bilayer photoresist stack, and
   h) etching the visible undercoat in an oxidizing plasma to produce a bilayer relief image.

13. A bilayer photoresist stack comprising a substrate, an undercoat layer, on the substrate, and a coating of the photosensitive composition of claim 8 on the undercoat.

14. A polymer according to claim 3 wherein the acid-sensitive ethylenically unsaturated polymerizable monomer is selected from the group consisting of a monomer of Structure II, III, and IV

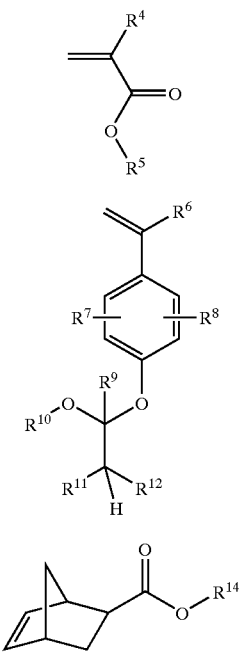

Structure II

Structure III

Structure IV wherein $R^4$ is selected from the group consisting of hydrogen, $C_{1-3}$ alkyl group, and a $C_{1-3}$ perfluorinated alkyl group, $R^5$ is selected from the group consisting of $C_{4-20}$ branched or cyclic alkyl, and $C_{2-8}$ linear or cyclic α-alkoxy alkyl, $R^6$ is selected from the group consisting of H, $C_1$–$C_4$ lower alkyl, CN, and $CH_2CO_2R^{13}$; $R^7$ and $R^8$ are each independently selected from the group consisting of H, linear or branched $C_1$–$C_4$ alkyl, and halogen; $R^9$ is selected from the group consisting of H, and branched or linear $C_1$–$C_4$ alkyl; $R^{10}$ is selected from the group consisting of substituted or unsubstituted phenyl, a substituted or unsubstituted linear, branched or cyclic $C_1$–$C_{20}$ alkyl, optionally containing an ether or ester group, a substituted or unsubstituted phenylalkylene and a substituted or unsubstituted $C_6$–$C_{20}$ cyclic alkylene; $R^{11}$ and $R^{12}$ are independently selected from the group consisting of H, linear or branched or cyclic $C_1$–$C_{14}$ alkyl, and $C_7$–$C_{14}$ alicyclic; $R^{13}$ is selected from the group consisting of a $C_1$–$C_{14}$ branched linear or cyclic alkyl, substituted or unsubstituted phenyl, and $C_7$–$C_{14}$ alicyclic group, and $R^{14}$ is an acid cleavable protecting group that generates carboxylic acid when cleaved by acid.

15. A polymer according to claim 14 wherein the polymer additionally has monomeric units from polymerization of another silicon monomer having a polymerizable double bond.

16. A polymer according to claim 15 wherein the other silicon monomer is selected from the group consisting of allytrimethylsilane, vinyltrimethylsilane, methacryloxy methyltrimethylsilane, methacryloxy propyltris(trimethylsiloxy)silane, and a POSS molecule of Structure IX.

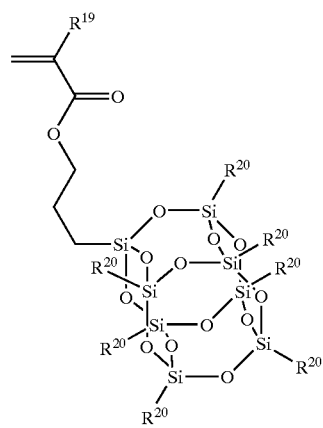

wherein $R^{19}$ is selected from the group consisting of hydrogen, a $C_{1-3}$ linear or branched alkyl group, and a linear or branched $C_{1-3}$ perfluorinated alkyl group; each $R^{20}$ is independently selected from the group consisting of hydrogen, a $C_{1-20}$ linear, branched, or a cyclic alkyl group, a $C_{7-20}$ alicyclic alkyl group, and a $C_{1-10}$ aromatic group.

17. A polymer according to claim 15 wherein the polymer additionally comprises monomeric units from polymerization of at least one other ethylenically unsaturated, polymerizable property enhancing monomer.

18. A polymer according to claim 17 wherein the other ethylenically unsaturated, polymerizable property enhancing monomer is selected from the group consisting of a monomer of Structures V, VI and VII

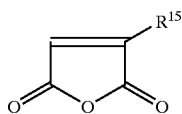

Structure V

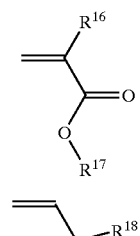

Structure VI

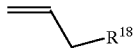

Structure VII wherein $R^{15}$ is selected from the group consisting of H, a $C_{1-4}$ linear or branched alkyl and a linear or branched $C_{1-4}$ alkoxy group; $R^{16}$ is selected from the group consisting of hydrogen, a $C_{1-3}$ linear or branched alkyl group, and a linear or branched $C_{1-3}$ perfluorinated alkyl group; $R^{17}$ is selected from the group consisting of a $C_{1-20}$ linear, branched, or cyclic alkyl group, $C_{7-20}$ alicyclic alkyl group, a $C_{1-20}$ linear, branched, or cyclic ether group, and a $C_{1-10}$ aromatic group; and $R^{18}$ is selected from the group consisting of a $C_{1-8}$ alkoxy, or a $C_{1-8}$ alkyl ester, alkyl carboxylate, and hydroxyl group.

19. A polymer according to claim 14 wherein the polymer additionally comprises monomeric units from polymerization of at least one other ethylenically unsaturated, polymerizable property enhancing monomer.

20. A polymer according to claim 19 wherein the other ethylenically unsaturated, polymerizable property enhancing monomer is selected from the group consisting of a momomer of Structures V, VI and VII

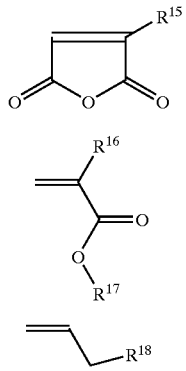

Structure V

Structure VI

Structure VII wherein $R^{15}$ is selected from the group consisting of a H, $C_{1-4}$ linear or branched alkyl and a linear or branched $C_{1-4}$ alkoxy group; $R^{16}$ is selected from the group consisting of hydrogen, a $C_{1-3}$ linear or branched alkyl group, and a linear or branched $C_{1-3}$ perfluorinated alkyl group; $R^{17}$ is selected from the group consisting of a $C_{1-20}$ linear, branched, or cyclic alkyl group, $C_{7-20}$ alicyclic alkyl group, a $C_{1-20}$ linear, branched, or cyclic ether group, and a $C_{1-10}$ aromatic group; and $R^{18}$ is selected from the group consisting of a $C_{1-8}$ alkoxy, or a $C_{1-8}$ alkyl ester, alkyl carboxylate, and hydroxyl group.

21. A polymer according to claim 19 wherein the acid-sensitive ethylenically unsaturated polymerizable monomer comprises a monomer of Structure II

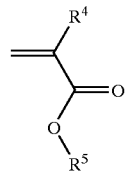

Structure II wherein $R^4$ is selected from the group consisting of hydrogen, $C_{1-3}$ alkyl group, and a $C_{1-3}$ perfluorinated alkyl group, and $R^5$ is selected from the group consisting of $C_{4-20}$ branched or cyclic alkyl, and $C_{2-8}$ linear or cyclic α-alkoxy alkyl and the ethylenically unsaturated, polymerizable property enhancing monomer is maleic anhydrid.

22. A photosensitive composition comprising:
 a. at least one polymer;
 b. at least one photoacid generator, and
 c. at least one solvent,
wherein the at least one polymer comprises a polymer of claim 21.

23. A photosensitive composition according to claim 22 wherein the at least one photoacid generator comprises a photoacid generator that generates sulfonic acid.

24. A photosensitive composition according to claim 22 wherein the at least one photoacid generator comprises a photoacid generator selected from the group consisting of iodonium and sulfonium sulfonates.

25. A photosensitive composition according to claim 24 wherein the sulfonate is a fluorinated sulfonate.

26. A photosensitive composition according to claim 22 herein the at least one photoacid generator comprises a sulfonium sulfonate.

27. A process for the lithographic treatment of a substrate by means of a bilayer photoresist process, the process comprising:
 a) providing a substrate,
 b) coating in a first coating step said substrate with an undercoat solution,
 c) baking to remove solvent,
 d) coating in a second coating step a photosensitive composition of claim 22 over the undercoat to produce a bilayer photoresist stack,
 e) exposing the bilayer resist stack,
 f) developing the photosensitive composition portion of the bilayer photoresist stack making a portion of the underlying undercoat visible,
 g) rinsing the bilayer photoresist stack, and
 h) etching the visible undercoat in an oxidizing plasma to produce a bilayer relief image.

28. A bilayer photoresist stack comprising a substrate, an undercoat layer, on the substrate, and a coating of the photosensitive composition of claim 22 on the undercoat.

29. A photosensitive composition comprising:
 a. at least one polymer;
 b. at least one photoacid generator, and
 c. at least one solvent,
wherein the at least one polymer comprises a polymer of claim 19 and the acid-sensitive ethylenically unsaturated polymerizable monomer is one of Structure II.

30. A photosensitive composition according to claim 29 wherein the ethylenically unsaturated, polymerizable property enhancing monomer is maleic anhydride.

31. A photosensitive composition according to claim 30 wherein the at least one photoacid generator comprises a photoacid generator that generates sulfonic acid.

32. A photosensitive composition according to claim 30 wherein the at least one photoacid generator comprises a photoacid generator selected from the group consisting of iodonium and sulfonium sulfonates.

33. A photosensitive composition according to claim 32 wherein the sulfonate is a fluorinated sulfonate.

34. A process for the lithographic treatment of a substrate by means of a bilayer photoresist process, the process comprising:
 a) providing a substrate,
 b) coating in a first coating step said substrate with an undercoat solution,
 d) baking to remove solvent,
 d) coating in a second coating step a photosensitive composition of claim 29 over the undercoat to produce a bilayer photoresist stack,
 e) exposing the bilayer resist stack,
 f) developing the photosensitive composition portion of the bilayer photoresist stack making a portion of the underlying undercoat visible,
 g) rinsing the bilayer photoresist stack, and
 h) etching the visible undercoat in an oxidizing plasma to produce a bilayer relief image.

35. A bilayer photoresist stack comprising a substrate, an undercoat layer, on the substrate, and a coating of the photosensitive composition of claim 29 on the undercoat.

36. A photosensitive composition comprising:
 a. at least one polymer;
 b. at least one photoacid generator, and
 c. at least one solvent, wherein the at least one polymer comprises a polymer of claim 14 and the acid-sensitive ethylenically unsaturated polymerizable monomer is one of Structure II.

37. A photosensitive composition according to claim 36 wherein the at least one photoacid generator comprises a photoacid generator that generates sulfonic acid.

38. A photosensitive composition according to claim 37 wherein the at least one photoacid generator comprises a photoacid generator selected from the group consisting of iodonium and sulfonium sulfonates.

39. A photosensitive composition according to claim 38 wherein the sulfonate is a fluorinated sulfonate.

40. A process for the lithographic treatment of a substrate by means of a bilayer photoresist process, the process comprising:
   a) providing a substrate,
   b) coating in a first coating step said substrate with an undercoat solution,
   c) baking to remove solvent,
   d) coating in a second coating step a photosensitive composition of claim 36 over the undercoat to produce a bilayer photoresist stack,
   e) exposing the bilayer resist stack,
   f) developing the photosensitive composition portion of the bilayer photoresist stack making a portion of the underlying undercoat visible,
   g) rinsing the bilayer photoresist stack, and
   h) etching the visible undercoat in an oxidizing plasma to produce a bilayer relief image.

41. A bilayer photoresist stack comprising a substrate, an undercoat layer, on the substrate, and a coating of the photosensitive composition of claim 36 on the undercoat.

42. A polymer according to claim 3 wherein the polymer additionally comprises monomeric units from polymerization of another silicon monomer having a polymerizable double bond.

43. A polymer according to claim 42 wherein the polymer additionally comprises momomeric units from polymerization of at least one other ethylenically unsaturated, polymerizable property enhancing monomer.

44. A polymer according to claim 43 wherein the other ethylenically unsaturated, polymerizable property enhancing monomer is selected from the group consisting of a monomer of Structure V, VI and VII

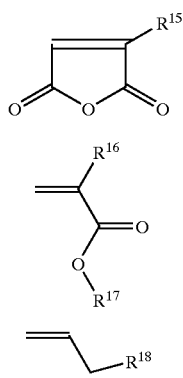

Structure V

Structure VI

Structure VII wherein $R^{15}$ is selected from the group consisting of H, a $C_{1-4}$ linear or branched alkyl and a linear or branched $C_{1-4}$ alkoxy group; $R^{16}$ is selected from the group consisting of hydrogen, a $C_{1-3}$ linear or branched alkyl group, and a linear or branched $C_{1-3}$ perfluorinated alkyl group; $R^{17}$ is selected from the group consisting of a $C_{1-20}$ linear, branched, or cyclic alkyl group, $C_{7-20}$ alicyclic alkyl group, a $C_{1-20}$ linear, branched, or cyclic ether group, and a $C_{1-10}$ aromatic group; and $R^{18}$ is selected from the group consisting of a $C_{1-8}$ alkoxy, or a $C_{1-8}$ alkyl ester, alkyl carboxylate, and hydroxyl group.

45. A polymer according to claim 43 wherein the monomer of Structure I is selected from the group consisting of 1,1,3,3-tetramethyl-1,3-disila-2-oxacyclohexane-carboxylic acid allyl ester and 1,1,3,3-tetramethyl-1,3-disila-2-oxacyclohexane-carboxylic acid β-methallyl ester, the acid sensitive ethylenically unsaturated, polymerizable monomer is a monomer of Structure II,

Structure II wherein $R^4$ is selected from the group consisting of hydrogen, $C_{1-3}$ alkyl group, and a $C_{1-3}$ perfluorinated alkyl group and $R^5$ is selected from the group consisting of $C_{4-20}$ branched or cyclic alkyl, and $C_{2-8}$ linear or cyclic α-alkoxy alkyl, and the other silicon monomer is 3-(3,5,7,9,11,13,15-heptaethylpentacyclo[9.5.1.1$^{3,9}$.1$^{5,15}$.1$^{7,13}$]octa-siloxan-1-yl)propyl methacrylate.

46. A polymer according to claim 45 wherein the monomer of Structure II is selected from the group consisting of t-butyl acrylate and t-butyl methacrylate.

47. A polymer according to claim 3 wherein the polymer additionally comprises monomeric units from polymerization of at least one other ethylenically unsaturated, polymerizable property enhancing monomer.

48. A polymer according to claim 47 wherein the other ethylenically unsaturated, polymerizable property enhancing monomer is selected from the group consisting of a monomer of Structure V, VI and VII

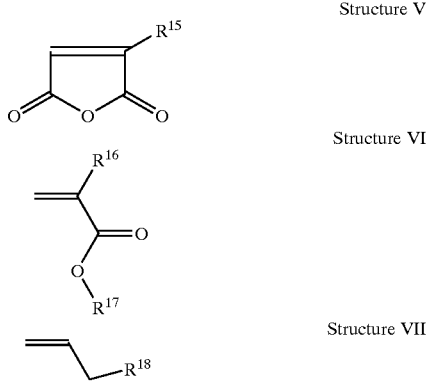

Structure V

Structure VI

Structure VII wherein $R^{15}$ is selected from the group consisting of H, a $C_{1-4}$ linear or branched alkyl and a linear or branched $C_{1-4}$ alkoxy group; $R^{16}$ is selected from the group consisting of hydrogen, a $C_{1-3}$ linear or branched alkyl group, and a linear or branched $C_{1-3}$ perfluorinated alkyl group; $R^{17}$ is selected from the group consisting of a $C_{1-20}$ linear, branched, or cyclic alkyl group, $C_{7-20}$ alicyclic alkyl group, a $C_{1-20}$ linear, branched, or cyclic ether group, and a $C_{1-10}$ aromatic group; and $R^{18}$ is selected from the group consisting of a $C_{1-8}$ alkoxy, or a $C_{1-8}$ alkyl ester, alkyl carboxylate, and hydroxyl group.

49. A polymer according to claim 47 wherein the monomer of Structure I is selected from the group consisting of 1,1,3,3-tetramethyl-1,3-disila-2-oxacyclohexane-carboxylic acid allyl ester and 1,1,3,3-tetramethyl-1,3-disila-2-oxacyclohexane-carboxylic acid β-methallyl ester, and the acid sensitive ethylenically unsaturated, polymerizable monomer is a monomer of Structure II,

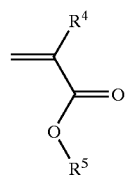

Structure II wherein $R^4$ is selected from the group consisting of hydrogen, $C_{1-3}$ alkyl group, and a $C_{1-3}$ perfluorinated alkyl group and $R^5$ is selected from the group consisting of $C_{4-20}$ branched or cyclic alkyl, and $C_{2-8}$ linear or cyclic α-alkoxy alkyl.

50. A polymer according to claim 49 wherein the monomer of Structure II is selected from the group consisting of t-butyl acrylate and t-butyl methacrylate.

51. A photosensitive composition comprising:
  a) at least one polymer;
  b) at least one photoacid generator, and
  c) at least one solvent,
wherein the at least one polymer comprises a polymer of claim 50.

52. A photosensitive composition according to claim 51 wherein the at least one photoacid generator comprises a photoacid generator that generates sulfonic acid.

53. A photosensitive composition according to claim 51 wherein the at least one photoacid generator comprises a photoacid generator selected from the group consisting of iodonium and sulfonium sulfonates.

54. A photosensitive composition according to claim 53 wherein the sulfonate is a fluorinated sulfonate.

55. A photosensitive composition according to claim 51 wherein the at least one photoacid generator comprises a sulfonium sulfonate.

56. A process for the lithographic treatment of a substrate by means of a bilayer photoresist process, the process comprising:
  a) providing a substrate,
  b) coating in a first coating step said substrate with an undercoat solution,
  c) baking to remove solvent,
  d) coating in a second coating step a photosensitive composition of claim 51 over the undercoat to produce a bilayer photoresist stack,
  e) exposing the bilayer resist stack,
  f) developing the photosensitive composition portion of the bilayer photoresist stack making a portion of the underlying undercoat visible,
  g) rinsing the bilayer photoresist stack, and
  h) etching the visible undercoat in an oxidizing plasma to produce a bilayer relief image.

57. A bilayer photoresist stack comprising a substrate, an undercoat layer, on the substrate, and a coating of the photosensitive composition of claim 51 on the undercoat.

58. A photosensitive composition comprising:
  a. at least one polymer;
  b. at least one photoacid generator, and
  c. at least one solvent,
wherein the at least one polymer comprises a polymer of claim 3.

59. A photosensitive composition according to claim 58 wherein the at least one photoacid generator comprises a photoacid generator that generates sulfonic acid.

60. A photosensitive composition according to claim 58 wherein the at least one photoacid generator comprises a photoacid generator selected from the group consisting of iodonium and sulfonium sulfonates.

61. A photosensitive composition according to claim 60 wherein the sulfonate is a fluorinated sulfonate.

62. A process for the lithographic treatment of a substrate by means of a bilayer photoresist process, the process comprising:
  a) providing a substrate,
  b) coating in a first coating step said substrate with an undercoat solution,
  c) baking to remove solvent,
  d) coating in a second coating step a photosensitive composition of claim 58 over the undercoat to produce a bilayer photoresist stack,
  e) exposing the bilayer resist stack,
  f) developing the photosensitive composition portion of the bilayer photoresist stack making a portion of the underlying undercoat visible,
  g) rinsing the bilayer photoresist stack, and
  h) etching the visible undercoat in an oxidizing plasma to produce a bilayer relief image.

63. A process for the lithographic treatment of a substrate, the process comprising:
  a) providing a substrate,
  b) coating the substrate with a photosensitive composition of claim 58,
  c) exposing the coated substrate,
  d) developing the photosensitive composition portion of the coated substrate, and
  e) rinsing the developed substrate to produce a relief image.

64. A bilayer photoresist stack comprising a substrate, an undercoat layer, on the substrate, and a coating of the photosensitive composition of claim 58 on the undercoat.

* * * * *